(12) United States Patent
Lu

(10) Patent No.: US 11,043,261 B2
(45) Date of Patent: *Jun. 22, 2021

(54) MEMORY CIRCUIT CONFIGURATION

(71) Applicant: TAIWAN SEMICONDUCTOR MANUFACTURING COMPANY, LTD., Hsinchu (TW)

(72) Inventor: Shih-Lien Linus Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/007,950

(22) Filed: Aug. 31, 2020

(65) Prior Publication Data

US 2020/0395065 A1 Dec. 17, 2020

Related U.S. Application Data

(63) Continuation of application No. 16/691,175, filed on Nov. 21, 2019, now Pat. No. 10,762,952, which is a continuation of application No. 15/927,044, filed on Mar. 20, 2018, now Pat. No. 10,515,689.

(51) Int. Cl.

| | |
|---|---|
| *G11C 8/00* | (2006.01) |
| *G11C 11/418* | (2006.01) |
| *G11C 11/419* | (2006.01) |
| *G11C 8/10* | (2006.01) |
| *G11C 7/08* | (2006.01) |
| *G11C 11/412* | (2006.01) |

(52) U.S. Cl.
CPC ............. *G11C 11/418* (2013.01); *G11C 7/08* (2013.01); *G11C 8/10* (2013.01); *G11C 11/412* (2013.01); *G11C 11/419* (2013.01)

(58) Field of Classification Search
CPC ........... G11C 11/418; G11C 7/08; G11C 8/10; G11C 11/412; G11C 11/419
See application file for complete search history.

(56) References Cited

U.S. PATENT DOCUMENTS

| | | | | |
|---|---|---|---|---|
| 5,835,429 | A * | 11/1998 | Schwarz | G11C 29/50 |
| | | | | 365/201 |
| 5,956,279 | A | 9/1999 | Mo et al. | |
| 6,272,035 | B1 * | 8/2001 | Dietrich | G11C 7/1006 |
| | | | | 365/189.15 |
| 6,272,935 | B1 | 8/2001 | Strubbe | |

(Continued)

FOREIGN PATENT DOCUMENTS

WO    2006124486    11/2006

OTHER PUBLICATIONS

Office Action dated Dec. 17, 2018 from corresponding application No. DE 10 2018 107 201.5.

*Primary Examiner* — Pho M Luu

(74) *Attorney, Agent, or Firm* — Hauptman Ham, LLP

(57) ABSTRACT

A circuit includes a first cell in a first row of a memory array, a second cell in a second row of the memory array, and a data line perpendicular to the first row and the second row, intersecting each of the first cell and the second cell, and electrically coupled with each of the first cell and the second cell. The circuit is configured to simultaneously transfer data from the first cell and the second cell to the data line in a read operation on the first row.

20 Claims, 10 Drawing Sheets

(56) References Cited

U.S. PATENT DOCUMENTS

| | | | |
|---|---|---|---|
| 8,724,390 B2* | 5/2014 | Hung | G11C 16/26 |
| | | | 365/185.13 |
| 9,257,196 B2* | 2/2016 | Kim | G11C 7/20 |
| 10,515,689 B2* | 12/2019 | Lu | G11C 7/08 |
| 10,762,952 B2* | 9/2020 | Lu | G11C 11/412 |
| 2005/0188289 A1 | 8/2005 | Berndlmaier et al. | |
| 2015/0155055 A1 | 6/2015 | Kim et al. | |

* cited by examiner

MEMORY CIRCUIT CONFIGURATION

PRIORITY CLAIM

The present application is a continuation of U.S. patent application Ser. No. 16/691,175, filed Nov. 21, 2019, now U.S. Pat. No. 10,762,952, which is a continuation of U.S. application Ser. No. 15/927,044, filed Mar. 20, 2018, now U.S. Pat. No. 10,515,689, issued Dec. 24, 2019, all of which are incorporated herein by reference in their entireties.

BACKGROUND

Memory array data access includes read and write operations having speeds that depend on memory cell type, memory circuit design, operating voltages, and temperature and manufacturing process variations. Overall speed of a system that includes a memory array is sometimes based on memory access speeds.

In many applications, memory circuits are operated at low voltages to limit power consumption and heat generation. As operating voltages decrease, circuit speeds and therefore memory access speeds typically decrease.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
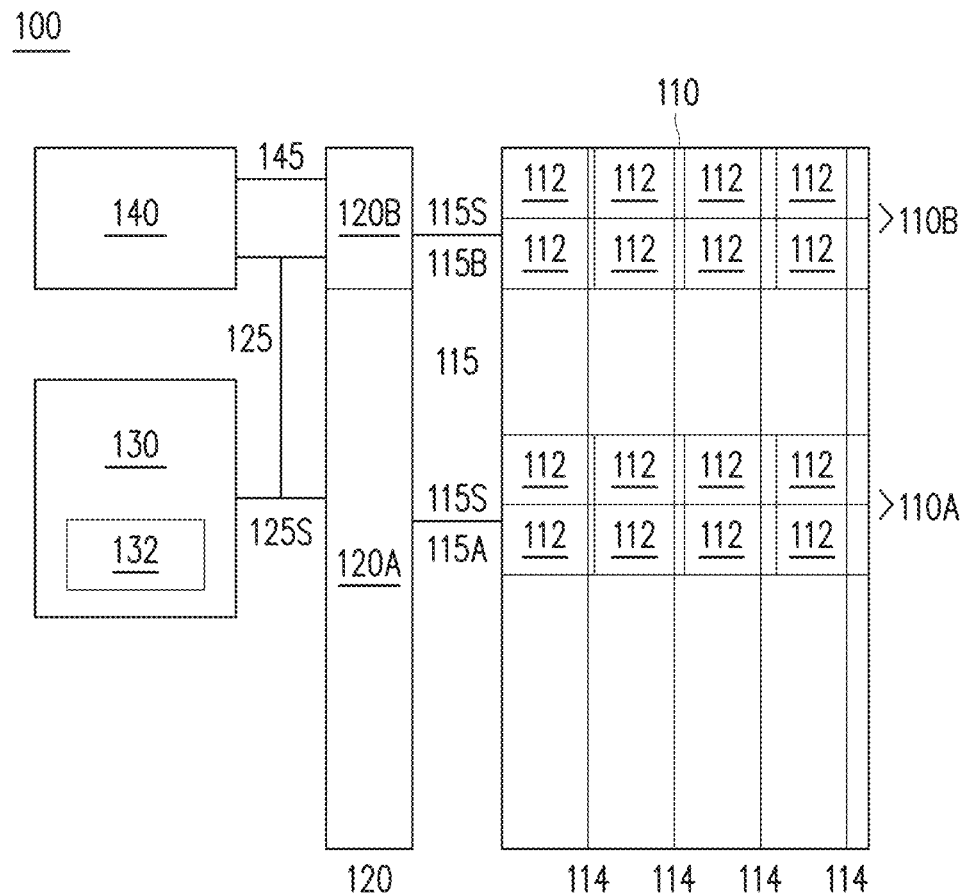
FIG. 1A is a diagram of a memory circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a weak cell in a row of a memory circuit is identified based on a speed of a test read operation, and address information corresponding to an address of the row is stored in a storage device. During subsequent read operations on the row including the weak cell, data are simultaneously read from the weak cell and from a cell in a second row of the memory circuit based on the stored address information, thereby improving speeds of the subsequent read operations.

In various embodiments, a memory circuit includes a first row of memory cells including a weak cell, and a second row of memory cells, the second row configured to be enabled during read and write operations on the first row of memory cells. By pairing the second row with the first row and enabling the first row to be operated at increased read operation speeds, overall operating speed of the memory circuit is increased and a lowered operating voltage of the memory circuit is enabled.

FIG. 1A is a diagram of a memory circuit 100, in accordance with some embodiments. Memory circuit 100 includes a memory array 110, an address decoding circuit 120 communicatively coupled with memory array 110 through a read/write (R/W) signal bus 115, a control circuit 130 communicatively coupled with address decoding circuit 120 through a control signal bus 125, and a storage device 140 communicatively coupled with control circuit 130 through control signal bus 125 and communicatively coupled with address decoding circuit 120 through a reference address bus 145.

Two or more circuit elements are considered to be communicatively coupled based on a direct signal connection or on an indirect signal connection that includes one or more logic devices, e.g., an inverter or logic gate, between the two or more circuit elements. In some embodiments, signal communications between the two or more communicatively coupled circuit elements are capable of being modified, e.g., inverted or made conditional, by the one or more logic devices.

In some embodiments, memory circuit 100 is a memory macro. In some embodiments, memory circuit 100 is a subset of a memory macro that includes one or more additional components, e.g., at least one memory array (not shown) in addition to memory array 110.

Memory array 110 includes an array of memory cells 112. Memory cells 112 are electrical, electromechanical, electromagnetic, or other devices configured to store data represented by logical states. The logical states of memory cells 112 are capable of being programmed in a write operation and detected in a read operation.

In various embodiments, a logical state corresponds to a voltage level of an electrical charge stored in a memory cell 112, a physical property, e.g., a resistance or magnetic orientation, of a component of a memory cell 112, or another configurable aspect of a memory cell 112.

In some embodiments, memory cells 112 are static random-access memory (SRAM) cells. In some embodiments, memory cells 112 are eight-transistor (8T) SRAM cells, e.g., memory cells 300 discussed below with respect to FIG. 3. In some embodiments, memory cells 112 are nine-transistor (9T) SRAM cells, e.g., memory cells 400 discussed below with respect to FIG. 4.

In some embodiments, memory cells 112 are dynamic random-access memory (DRAM) cells.

Memory cells 112 are arranged as a set of rows 110A and a set of rows 110B. In the embodiment depicted in FIG. 1A, each set of set of rows 110A and set of rows 110B includes two rows of memory cells 112. In some embodiments, one or both sets of set of rows 110A or set of rows 110B includes one row of memory cells 112.

In the embodiment depicted in FIG. 1A, memory array 110 does not include an additional row of memory cells 112 between set of rows 110A and set of rows 110B. In some embodiments, memory array 110 includes one or more additional rows (not shown) of memory cells 112 between set of rows 110A and set of rows 110B.

In the embodiment depicted in FIG. 1, memory circuit 100 has a data storage capacity based solely on a number of rows in set of rows 110A, and set of rows 110B is configured as a set of rows supplemental to set of rows 110A. In some embodiments, memory circuit 100 has a data storage capacity based on a total number of rows in set of rows 110A and set of rows 110B.

In the embodiment depicted in FIG. 1A, set of rows 110A includes a total of two rows of memory cells 112. In some embodiments, set of rows 110A includes a number of rows greater than two. In some embodiments, set of rows 110A includes a number of rows ranging from 4 to 1024. In some embodiments, set of rows 110A includes a number of rows ranging from 128 to 512.

In the embodiment depicted in FIG. 1A, set of rows 110B includes a total of two rows of memory cells 112. In some embodiments, set of rows 110B includes a number of rows greater than two. In some embodiments, set of rows 110B includes a number of rows ranging from 4 to 32.

In the embodiment depicted in FIG. 1A, each row of set of rows 110A and set of rows 110B includes four memory cells 112. In various embodiments, each row of set of rows 110A and set of rows 110B includes fewer or greater than four memory cells 112. In some embodiments, each row of set of rows 110A and set of rows 110B includes a number of memory cells 112 ranging from 4 to 128. In some embodiments, each row of set of rows 110A and set of rows 110B includes a number of memory cells 112 ranging from 32 to 64.

Read data lines 114 are conductive lines in memory array 110 that are oriented perpendicular to, and intersect, each row of set of rows 110A and set of rows 110B. In the embodiment depicted in FIG. 1A, each memory cell 112 is intersected by one read data line 114. In some embodiments, each memory cell 112 is intersected by greater than one read data line 114. A total number of read data lines 114 is based on the number of memory cells 112 in each row of set of rows 110A and set of rows 110B and the type of memory cells 112 in memory array 110.

Memory array 110 is configured to store, in memory cells 112, data received from an external circuit (not shown) through write data lines (not shown), and to output data from memory cells 112 to the external circuit through read data lines 114. In write operations, received data are stored at row locations activated by corresponding read/write signals 115S received from R/W signal bus 115. In read operations, stored data are output from row locations activated by corresponding read/write signals 115S received from R/W signal bus 115.

Address decoding circuit 120 includes a logic circuit configured to generate read/write signals 115S based on control signals 125S received from control signal bus 125, and to output read/write signals 115S to R/W signal bus 115. R/W signal bus 115 includes a plurality of write signal lines corresponding to the memory cell rows of memory array 110 and a plurality of read signal lines, e.g., read signal lines RWL1 and RWL2 discussed below with respect to FIG. 2, corresponding to the memory cell rows of memory array 110.

Control signals 125S include row address information usable by address decoding circuit 120 to determine a write signal line on which to output a particular read/write signal 115S indicating to activate a given row of set of rows 110A in a write operation, and to determine a read signal line on which to output a particular read/write signal 115S indicating to activate a given row of set of rows 110A in a read operation.

In various embodiments, the row address information includes a row address of a row of set of rows 110A, a portion of a row address of a row of set of rows 110A, or an index or other identifier corresponding to a row address of a row of set of rows 110A.

In some embodiments, outputting a particular read/write signal 115S indicating to activate a given row in a read or write operation includes outputting the particular read/write signal 115S having a high logic voltage level. In some embodiments, outputting a particular read/write signal 115S indicating to activate a given row in a read or write operation includes outputting the particular read/write signal 115S having a low logic voltage level.

In some embodiments, control signals 125S include additional information usable by address decoding circuit 120 to perform additional operations, e.g., initiate and terminate write and read operations based on a timing of control signals 125S.

R/W signal bus 115 includes a R/W signal bus 115A corresponding to set of rows 110A and a R/W signal bus 115B corresponding to set of rows 110B. Address decoding circuit 120 includes an address decoding circuit 120A, e.g., address decoding circuit 520A discussed below with respect to FIG. 5A, corresponding to R/W signal bus 115A and an address decoding circuit 120B, e.g., address decoding circuit 520B discussed below with respect to FIGS. 5B and 5C, corresponding to R/W signal bus 115B.

Address decoding circuit 120A is communicatively coupled with control circuit 130 through control signal bus 125, and is configured to, in operation, generate and output read/write signals 115S to R/W signal bus 115A based on the row address information in control signals 125S received from control signal bus 125.

Address decoding circuit 120B is communicatively coupled with control circuit 130 through control signal bus 125 and communicatively coupled with storage device 140 through reference address bus 145. Address decoding circuit 120B is configured to, in operation, generate and output read/write signals 115S to R/W signal bus 115B based on a comparison of the row address information in control signals 125S with reference address information stored in storage device 140 and received from reference address bus 145.

The reference address information includes information usable by decoding circuit 120B, along with the row address information, to determine if a particular row of set of rows 110A is being activated in a write or read operation. Decoding circuit 120B is configured to respond to the row determined from the row address information matching the row determined from the reference address information by generating and outputting an activating read/write signal 115S on R/W signal bus 115B in the write or read operation.

The reference address information is further usable by decoding circuit 120B to determine a particular write signal line of R/W signal bus 115B on which to output the read/write signal 115S indicating to activate a corresponding row of set of rows 110B in the write operation, and to determine a particular read signal line of R/W signal bus 115B on which to output the read/write signal 115S indicating to activate a corresponding row of set of rows 110B in the read operation. In some embodiments, decoding circuit 120B is configured to determine the particular write or read line based on one or more locations on reference address bus 145 at which the reference address information is received.

In various embodiments, the reference address information includes a row address of a row of set of rows 110A, a portion of a row address of a row of set of rows 110A, or an index or other identifier corresponding to a row address of a row of set of rows 110A.

Control circuit 130 includes one or more logic circuits configured to control operation of memory circuit 100 by receiving input signals on an input bus (not shown) and, based on the input signals, generating and outputting control signals 125S on control signal bus 125.

Control circuit 130 is configured to generate control signals 125S including the row address information received by address decoding circuit 120 as discussed above. Control circuit 130 is further configured to generate and output control signals 125S to control signal bus 125 including the reference address information.

Storage device 140 includes a volatile or non-volatile storage medium capable of receiving the reference address information from control signal bus 125, storing the reference address information, and outputting the reference address information to reference address bus 145. In some embodiments, in operation, storing the reference address information includes maintaining the reference address information in storage device 140 during periods when memory circuit 100 is in a powered down state.

In some embodiments, storage device 140 includes a non-volatile memory (NVM). An NVM includes storage elements capable of being configured responsive to control signals 125S so that reference address information is maintained in storage device 140 during periods when memory circuit 100 is in a powered down state. In some embodiments, an NVM includes one or more sets of fuses capable of being selectively opened responsive to control signals 125S, the pattern of opened fuses corresponding to the stored address information. In some embodiments, in operation, storing the reference address information includes opening one or more fuses in storage device 140.

Memory circuit 100 is thereby configured to, in operation, store the reference address information in storage device 140 and provide the reference address information to address decoding circuit 120B.

In a write or read operation in which data are written to or read from the memory cells 112 of a given row of set of rows 110A, control circuit 130 outputs control signals 125S including the row address information corresponding to the given row to control signal bus 125, and each of address decoding circuits 120A and 120B receives control signals 125S including the relevant row address information from control signal bus 125.

In the write operation, address decoding circuit 120A responds to receiving the relevant row address information by outputting the read/write signal 115S indicating to activate the given row on the write signal line of R/W signal bus 115A corresponding to the given row. In response to the activation indication, the memory cells 112 of the given row store data from the write data lines in accordance with logic voltage levels on corresponding write data lines.

In the read operation, address decoding circuit 120A responds to receiving the relevant row address information by outputting the read/write signal 115S indicating to activate the given row on the read signal line of R/W signal bus 115A corresponding to the given row. In response to the activation indication, the memory cells 112 of the given row transfer data to the read data lines 114. Transferring data in the read operation includes pre-charging the read data lines 114 to a pre-charge voltage level and selectively biasing the read data lines 114 to a bias voltage level based on the logical states of the memory cells 112 in the given row.

As discussed above, in both the write and read operations, address decoding circuit 120B responds to receiving the relevant row address information in control signals 125S by comparing the relevant row address information with the reference address information received from reference address bus 145. In operation, if the relevant row address information and the reference address information correspond to the same row of set of rows 110A, address decoding circuit 120B outputs a corresponding read/write signal 115S indicating to activate a first row of set of rows 110B on a corresponding write or read signal line of R/W signal bus 115B. In response to the activation indication, the memory cells 112 of the first row of set of rows 110B store data from the write data lines in the write operation and transfer data from the memory cells 112 to the read data lines 114 in the read operation.

Memory circuit 100 is configured so that the write and read operations on the given row of set of rows 110A and the first row of set of rows 110B are synchronized to have approximately the same initiation and termination times. In some embodiments, a timing of control signals 125S output to control signal bus 125 by control circuit 130 is usable by address decoding circuits 120A and 120B to control the initiation and termination times in the write and read operations.

In the write operation, the data on the write data lines are therefore simultaneously stored in the memory cells 112 of the given row of set of rows 110A and in the memory cells 112 of the first row of set of rows 110B.

In the read operation, the data stored in the memory cells 112 of the given row of set of rows 110A and in the first row of set of rows 110B are simultaneously transferred from the memory cells 112 of the given row of set of rows 110A and the first row of set of rows 110B to the read data lines 114. Because the data were previously simultaneously written to both the memory cells 112 of the given row of set of rows 110A and the memory cells 112 of the first row of set of rows 110B, the memory cells 112 of the given row of set of rows 110A have logical states that match the logical states of the corresponding memory cells 112 of the first row of set of rows 110B.

In the read operation, a data bit is transferred to a particular read data line 114 by selectively biasing the particular read data line 114 to the bias voltage level using both a corresponding memory cell 112 of the given row of set of rows 110A and a corresponding memory cell 112 of the first row of set of rows 110B.

Memory circuit 100 is thereby configured to operate the memory cells 112 in the first row of set of rows 110B as memory cells 112 redundant to the memory cells 112 of the given row of set of rows 110A in the write and read operations.

A speed at which a data bit is transferred in the read operation is a function of a memory cell current acting to bias a particular read data line 114 to the bias voltage level; non-limiting examples of memory cell currents are discussed below with respect to memory cells 210A-D, 300, and 400 and FIGS. 2, 3, and 4.

In the read operation on the given row of set of rows 110A, each selectively biased read data line 114 is biased by a sum of two memory cell currents: a first current provided by the corresponding memory cell 112 in the given row of set of rows 110A, and a second current provided by the corresponding redundant memory cell 112 in the first row of set of rows 110B. By providing the second memory cell currents, the redundant memory cells 112 cause the corresponding read data lines 114 to be biased in the read operation using total current levels above levels of the first memory cell currents. Due to the increased total currents acting to bias the selectively biased data lines 114, the speed of the read operation on the given row of set of rows 110A is increased.

In the read operation, a given memory cell current has a level based on a difference between the pre-charge voltage level on the corresponding read data line 114 and the bias voltage level, and on a resistance of a current path in the given memory cell 112.

The difference between the pre-charge and bias voltage levels is a function of an operating voltage of memory circuit 100. In some embodiments, the pre-charge voltage level is a function of the operating voltage of memory circuit 100. In some embodiments, the bias voltage level is a function of the operating voltage of memory circuit 100.

A value of the current path resistance is a function of the configuration and physical properties, e.g., transistor feature dimensions and/or doping concentration levels, of the given memory cell 112. In some embodiments, the current path resistance value is also a function of the operating voltage of memory circuit 100. In some embodiments, the current path includes a transistor channel controlled by a gate voltage, and the current path resistance value is a function of the operating voltage of memory circuit 100, on which the gate voltage is based.

Because, as discussed above, memory cell current levels are a function of both the physical properties of memory cells 112 and the operating voltage level of memory circuit 100, read operation speeds are a function of both the physical properties of memory cells 112 and the operating voltage level of memory circuit 100. A read operation speed of a memory cell 112 therefore includes an intrinsic component corresponding to the physical properties and an extrinsic component corresponding to the operating voltage level.

Due to manufacturing process variations, memory cells 112 have non-uniform physical properties, thereby causing the intrinsic read operation speed components to be non-uniform. In some embodiments, an overall speed of memory circuit 100 is limited based on a memory cell 112 having a slowest intrinsic read operation speed component.

In some embodiments, intrinsic read operation speed component variations are described by a statistical distribution. In some embodiments, intrinsic read operation speed component variations are described by a Gaussian distribution.

Figure 1B:
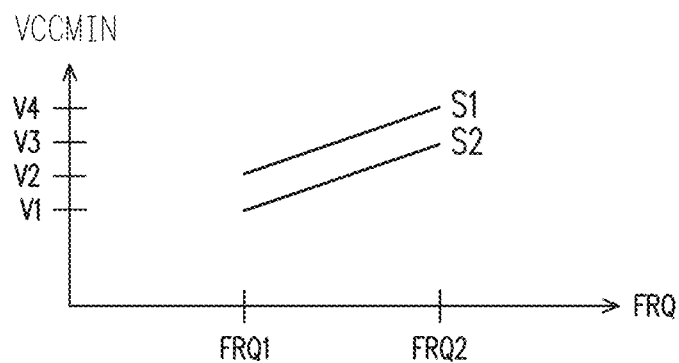
FIGS. 1B and 1C are plots of memory circuit operating parameters, in accordance with some embodiments.
Figure 1C:
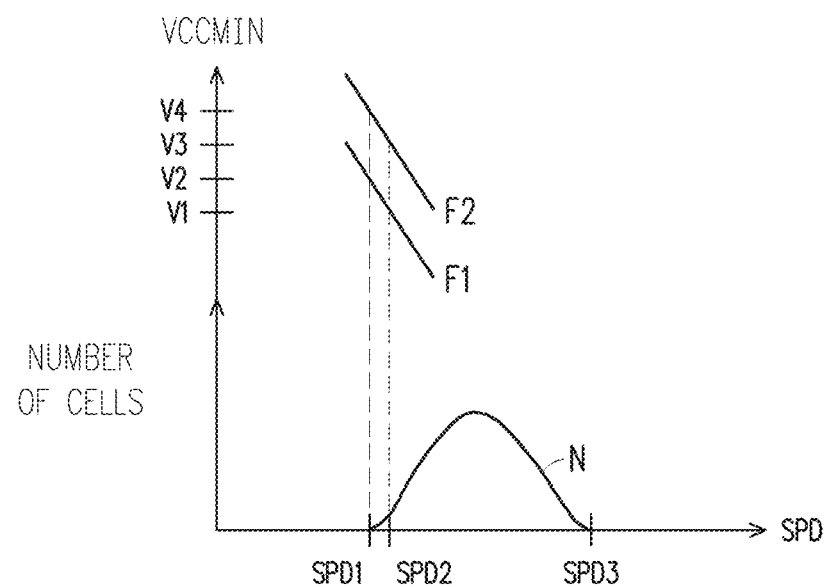

FIGS. 1B and 1C are plots of operating parameters of memory circuit 100, in accordance with some embodiments. FIG. 1B depicts a relationship between an operating frequency FRQ and a minimum operating voltage VCCMIN of memory circuit 100, in some embodiments. FIG. 1C depicts a relationship between an intrinsic read operation speed component SPD of memory circuit 100 and minimum operating voltage VCCMIN, in some embodiments.

In FIG. 1B, operating frequency FRQ is depicted along the x-axis, and operating voltage VCCMIN is depicted along the y-axis. A curve S1 represents the relationship between operating frequency FRQ and minimum operating voltage VCCMIN for a lowest intrinsic read operation speed component value SPD1, and a curve S2 represents the relationship between operating frequency FRQ and minimum operating voltage VCCMIN for an intrinsic read operation speed component value SPD2.

Curve S1 extends from an operating frequency value FRQ1 and a minimum operating voltage value V2 to an operating frequency value FRQ2 and a minimum operating voltage value V4. Curve S2 extends from operating frequency value FRQ1 and a minimum operating voltage value V1 to operating frequency value FRQ2 and a minimum operating voltage value V3.

A period in which a read operation on a memory cell 112 is required to be completed without a read error is based on operating frequency FRQ. Thus, as operating frequency FRQ increases, a minimum read operation speed also increases. As discussed above, read operation speeds increase as operating voltage levels increase. Accordingly, each of curves S1 and S2 has a positive slope, indicating that, for a given intrinsic read operation speed component value, minimum operating voltage VCCMIN increases as operating frequency FRQ increases.

Because curve S1 corresponds to the slowest intrinsic read operation speed component value SPD1, curve S2 corresponds to intrinsic read operation speed component value SPD2 having a value higher than that of slowest intrinsic read operation speed component value SPD1. Therefore, for each value of operating frequency FRQ, curve S1 represents a minimum operating voltage VCCMIN value higher than a corresponding minimum operating voltage VCCMIN value represented by curve S2.

In the embodiment depicted in FIGS. 1B and 1C, minimum operating voltage value V3 is greater than minimum operating voltage value V2. In some embodiments, minimum operating voltage value V3 is less than or equal to minimum operating voltage value V2.

In the embodiment depicted in FIGS. 1B and 1C, the relationships between operating frequency FRQ, minimum operating voltage VCCMIN, and intrinsic read operation speed component SPD are represented by straight lines for the purpose of illustration. In various embodiments, one or more relationships between operating frequency FRQ, minimum operating voltage VCCMIN, and intrinsic read operation speed component SPD are represented by curves other than straight lines.

In FIG. 1C, intrinsic read operation speed component SPD is depicted along the x-axis. A curve N in the lower portion of FIG. 1C represents a statistical distribution of a number of memory cells 112 as a function of intrinsic read operation speed component SPD. Curves F1 and F2 in the upper portion of FIG. 1C represent minimum operating voltage VCCMIN as a function of intrinsic read operation speed component SPD at operating frequency values FRQ1 and FRQ2, respectively.

Curve N extends from lowest intrinsic read operation speed component value SPD1 to a highest intrinsic read operation speed component value SPD3. In the embodiment depicted in FIG. 1C, curve N represents a Gaussian distribution of physical properties of memory cells 112 based on manufacturing process variations. In some embodiments, physical properties of memory cells 112 based on manufacturing process variations are represented by a curve from lowest intrinsic read operation speed component value SPD1 to highest intrinsic read operation speed component value SPD3 that represents a statistical distribution other than a Gaussian distribution.

Lowest intrinsic read operation speed component value SPD1 corresponds to a point on curve F1 representing minimum operating voltage value V2 and to a point on curve F2 representing minimum operating voltage value V4. Intrinsic read operation speed component value SPD2 corresponds to a point on curve F1 representing minimum operating voltage value V1 and to a point on curve F2 representing minimum operating voltage value V3.

Curves F1 and F2 thereby illustrate that, for a given operating frequency FRQ, an increase in intrinsic read operation speed component SPD from lowest value SPD1 to value SPD2 corresponds to a decrease in minimum operating voltage VCCMIN.

In some embodiments, a lowest possible value of operating voltage VCCMIN for memory circuit 100 is based on lowest intrinsic read operation speed component SPD1. In such embodiments, by increasing lowest intrinsic read operation speed component value SPD1 to a higher value, e.g., intrinsic read operation speed component value SPD2, the lowest possible value of operating voltage VCCMIN is decreased for a given operating frequency FRQ.

By the redundant memory cell configuration discussed above, memory circuit 100 is capable of increasing the currents used to transfer data from the memory cells 112 of the given row of set of rows 110A to the read data lines 114 in the read operation, thereby effectively increasing the intrinsic read operation speed component value of the memory cells 112 in the given row of set of rows 110A.

Memory circuit 100 is therefore capable of being configured to increase a read operation speed of a slowest memory cell 112 by identifying a row that includes a slowest memory cell 112 as the given row of set of rows 110A, and storing the corresponding reference address information in storage device 140 so that the memory cells 112 of the first row of set of rows 110B are operated as memory cells 112 redundant to the memory cells 112 of the given row of set of rows 110A in subsequent read operations.

Figure 7:
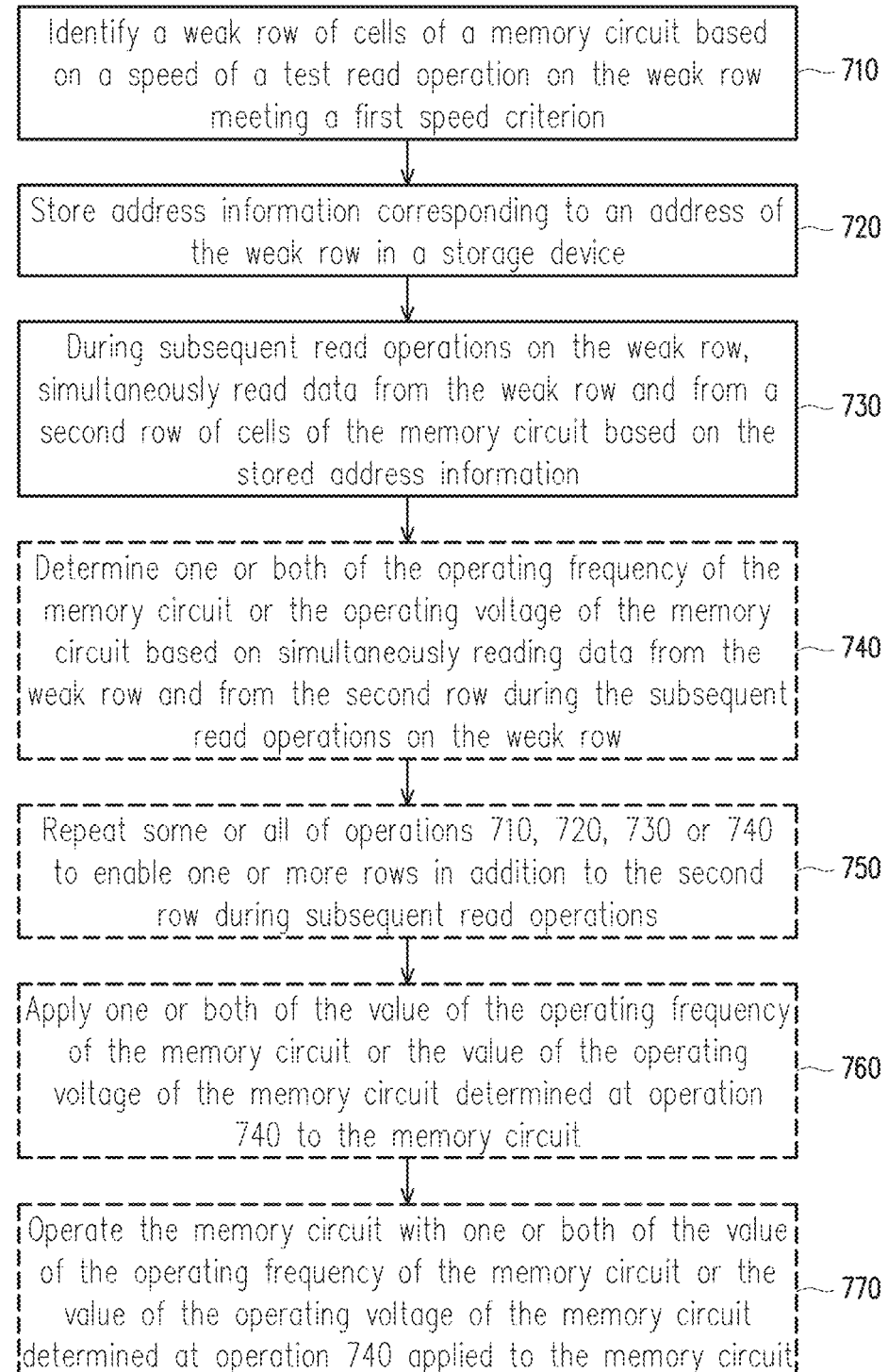
FIG. 7 is a flowchart of a method of configuring a memory circuit, in accordance with some embodiments.

To generate the reference address information stored in storage device 140 and used to identify the given row of set of rows 110A, control circuit 130 includes a test circuit 132. Test circuit 132 is a circuit configured to enable a determination that the given row of set of rows 110A meets a speed criterion during a read operation. In some embodiments, test circuit 132 is configured so that, in operation, some or all of the operations of method 700, discussed below with respect to FIG. 7, are executed using test circuit 132.

In some embodiments, test circuit 132 includes a built-in self-test (BIST) circuit configured to execute one or more write and/or read operations on each row of set of rows 110A. In some embodiments, test circuit 132 is configured to determine one or more execution speeds of one or more write and/or read operations on each row of set of rows 110A.

In some embodiments, test circuit 132 is configured to determine one or more execution speeds of one or more write and/or read operations on each row of set of rows 110A by measuring the one or more execution speeds of the one or more write and/or read operations on each row of set of rows 110A. In some embodiments, test circuit 132 is configured to determine one or more execution speeds of one or more write and/or read operations on each row of set of rows 110A by detecting one or more write or read errors associated with the one or more write and/or read operations on each row of set of rows 110A.

In some embodiments, by being configured to determine one or more execution speeds of one or more write and/or read operations on each row of set of rows 110A, test circuit 132 is capable of identifying a row including a weak cell, also referred to as a weak row. In operation, identifying a weak cell includes determining the one or more execution speeds while varying one or more operating parameters of memory circuit 100.

In some embodiments, test circuit 132 is configured to control an operating frequency of memory circuit 100. In some embodiments, test circuit 132 is configured to control an operating voltage level of memory circuit 100. In some embodiments, test circuit 132 is configured to determine one or more execution speeds of one or more write and/or read operations on each row of set of rows 110A by controlling one or both of an operating frequency of memory circuit 100 or an operating voltage level of memory circuit 100.

In some embodiments, test circuit 132 includes an interface configured to enable an external circuit (not shown) and/or a user to make a determination that the given row of set of rows 110A meets a speed criterion during a write and/or read operation.

In some embodiments, test circuit 132 is configured to measure a plurality of speeds corresponding to the one or more write and/or read operations on each row of set of rows 110A, and to make the determination that the given row of set of rows 110A meets the speed criterion based on a speed of the one or more write and/or read operations on the given row being one speed of one or more slowest speeds of the plurality of speeds.

In response to the determination that the given row of set of rows 110A meets the speed criterion during a write and/or read operation, control circuit 130 is configured to generate and output control signals 125S including the reference address information corresponding to the address of the given row to control signal bus 125.

In some embodiments, test circuit 132 is configured to determine that a given row of set of rows 110A meets a speed criterion for a single row of set of rows 110A. In some embodiments, test circuit 132 is configured to determine that a given row of set of rows 110A meets a speed criterion for multiple rows of set of rows 110A.

In some embodiments, control circuit 130 is configured to generate and output control signals 125S to control signal bus 125. Control signals 125S include reference address information corresponding to multiple addresses of rows of rows 110A that meet the speed criterion during the write and/or read operation.

In some embodiments, storage device 140 is configured to store and output to reference address bus 145 the reference address information corresponding to multiple addresses of multiple rows of set of rows 110A.

In some embodiments, address decoding circuit 120B is configured to compare relevant row address information in control signals 125S received from control signal bus 125 to the reference address information corresponding to multiple addresses of multiple rows of set of rows 110A received from reference address bus 145, and to output one read/write signal 115S of multiple read/write signals 115S indicating to activate one row of multiple rows of set of rows 110B on a corresponding write or read signal line of R/W signal bus 115B.

In some embodiments, memory circuit 100 is thereby configured to operate the memory cells 112 in multiple rows of set of rows 110B as memory cells 112 redundant to the memory cells 112 of multiple rows of set of rows 110A in the write and read operations. In some embodiments, memory circuit 100 is configured to operate the memory cells 112 in a single row of set of rows 110B as memory cells 112 redundant to the memory cells 112 of a single row of set of rows 110A in the write and read operations. In some embodiments, memory circuit 100 is configured to operate the memory cells 112 in multiple rows of set of rows 110B as memory cells 112 redundant to the memory cells 112 of a single row of set of rows 110A in the write and read operations.

The embodiment depicted in FIG. 1A is a non-limiting example of memory circuit 100. In some embodiments, memory circuit 100 has a configuration that differs from that depicted in FIG. 1A and is capable of operating one or more rows of set of rows 110B as redundant memory cells 112 so as to increase the speed of write and/or read operations of one or more rows of set of rows 110A.

In some embodiments, e.g., memory array 110 includes set of rows 110A and set of rows 110B as a single set of rows of memory cells 112. In some embodiments, e.g., address decoding circuit 120 is a single circuit. In some embodiments, e.g., R/W signal bus 115 is a single bus. In some embodiments, e.g., test circuit 132 is separate from control circuit 130. In some embodiments, e.g., storage device 140 is part of address decoding circuit 120. In some embodiments, e.g., storage device 140 is part of control circuit 130.

By increasing the speed of the given row of set of rows 110A identified as meeting the speed criterion using the redundant row of set of rows 110B, an overall operating speed of memory circuit 100 is capable of being increased by eliminating a slowest read operation of a plurality of speed operations. Memory circuit 100 is thereby capable of having an overall operating speed greater than an overall operating speed of a memory circuit that does not include a redundant row of memory cells, thereby improving memory circuit performance and compatibility with other circuits. Because memory circuit speed typically decreases as operating voltage decreases, for a given operating frequency, an increased memory circuit speed allows memory circuit 100 to be operated at a voltage value lower than a voltage value of a memory circuit without an increased memory circuit speed based on a redundant row of memory cells, thereby reducing energy consumption and power-related heat generation.

Figure 2:
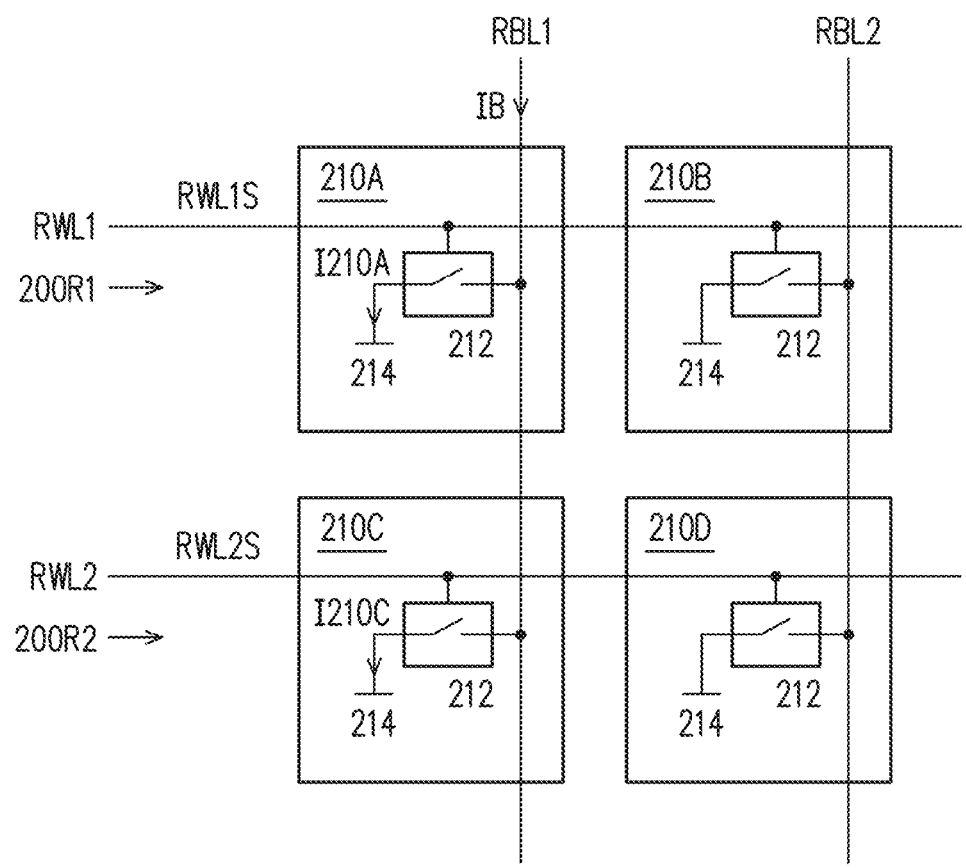
FIG. 2 is a diagram of a memory circuit, in accordance with some embodiments.

FIG. 2 is a diagram of a memory circuit 200, in accordance with some embodiments. Memory circuit 200 is usable as a portion of memory circuit 100, discussed above with respect to FIGS. 1A-1C. Memory circuit 200 includes cells 210A, 210B, 210C, and 210D each usable as memory cells 112, data lines RBL1 and RBL2 usable as read data lines 114, read signal line RWL1 usable as a portion of R/W signal bus 115A or 115B, and read signal line RWL2 usable as a portion of R/W signal bus 115A or 115B, each discussed above with respect to memory circuit 100 and FIGS. 1A-1C.

A row 200R1 includes cells 210A and 210B and is usable as a row of one of set of rows 110A or set of rows 110B, discussed above with respect to memory circuit 100 and FIGS. 1A-1C. Row 200R1 is configured to receive a read signal RWL1S from read signal line RWL1. A row 200R2 includes cells 210C and 210D and is usable as a row of the other of set of rows 110A or set of rows 110B, discussed above with respect to memory circuit 100 and FIGS. 1A-1C. Row 200R2 is configured to receive a read signal RWL2S from read signal line RWL2. Each of read signals RWL1S and RWL2S is usable as a read/write signal 115S, discussed above with respect to memory circuit 100 and FIGS. 1A-1C.

Each of data lines RBL1 and RBL2 is perpendicular to read signal lines RWL1 and RWL2 and intersects both of rows 200R1 and 200R2. Data line RBL1 intersects row 200R1 at cell 210A and intersects row 200R2 at cell 210C. Data line RBL2 intersects row 200R1 at cell 210B and intersects row 200R2 at cell 210D.

In the embodiment depicted in FIG. 2, each of cells 210A, 210B, 210C, and 210D is electrically coupled with a single data line, e.g., data line RBL1 or RBL2, and electrically coupled with a single read signal line, e.g., read signal line RWL1 or RWL2. In some embodiments, each of cells 210A, 210B, 210C, and 210D is electrically coupled with one or more additional data lines (not shown) and/or electrically coupled with one or more additional signal lines (not shown).

In various embodiments, two or more circuit elements are considered to be electrically coupled based on a direct electrical connection or on an electrical connection that includes another circuit element and is thereby capable of being controlled, e.g., made resistive or open by a transistor or other switching device.

Each of cells 210A, 210B, 210C, and 210D includes a switching device 212 electrically coupled with a data line, e.g., data line RBL1 or RBL2, and with a node 214 configured to carry a voltage level. Switching device 212 is communicatively coupled with a read signal line, e.g., one of read signal lines RWL1 or RWL2, so that, in operation, switching device 212 is either open or closed responsive to a signal, e.g., one of read signals RWL1S or RWL2S, on the read signal line. Switching device 212 is thereby configured to electrically couple the data line with node 214 responsive to the read signal received on the read signal line.

In various embodiments, switching device 212 includes a transistor, such as one or a combination of a field-effect transistor (FET), a metal-oxide-semiconductor field-effect transistor (MOSFET), a fin field-effect transistor (FinFET), an n-type transistor, or a p-type transistor, or another device capable of opening and closing responsive to a signal.

In some embodiments, switching device 212 includes a transistor having a first terminal electrically coupled with the data line, a second terminal electrically coupled with node 214, and a gate terminal electrically coupled with the signal line. In some embodiments, switching device 212 includes transistor 8TNM1 of memory cell 300, discussed below with respect to FIG. 3. In some embodiments, switching device 212 includes transistor 9TNM1, of memory cell 400 discussed below with respect to FIG. 4.

Each of cells 210A, 210B, 210C, and 210D is thereby configured to bias the data line toward the voltage level on node 214 in a read operation of the memory array. In some embodiments, biasing the data line toward the voltage level in the read operation includes causing a data line voltage level to approach, but not reach, the voltage level on node 214. In some embodiments, biasing the data line toward the voltage level in the read operation includes causing the data line voltage level to reach the voltage level on node 214.

In some embodiments, node 214 is configured to carry a predetermined voltage level, and each of cells 210A, 210B, 210C, and 210D is thereby configured to bias the data line toward the predetermined voltage level in the read operation.

In some embodiments, node 214 is a ground node configured to carry a ground reference voltage of the memory array, and each of cells 210A, 210B, 210C, and 210D is thereby configured to bias the data line toward a ground reference voltage level of the ground reference node in the read operation. In some embodiments, biasing the data line toward the ground reference voltage level of the ground reference node in the read operation includes discharging the data line. In some embodiments, biasing the data line toward the ground reference voltage level of the ground reference node in the read operation includes discharging the data line previously charged to a pre-charge voltage level as part of the read operation.

In some embodiments, node 214 is a power supply node configured to carry an operating voltage of the memory array, and each of cells 210A, 210B, 210C, and 210D is thereby configured to bias the data line toward an operating voltage level of the operating voltage node in the read operation. In some embodiments, biasing the data line toward the operating voltage level of the operating voltage node in the read operation includes charging the data line. In some embodiments, biasing the data line toward the operating voltage level of the operating voltage node in the read operation includes charging the data line previously discharged to the ground reference voltage level as part of the read operation.

In some embodiments, node 214 is a logic node configured to carry a logic voltage of the memory array, and each of cells 210A, 210B, 210C, and 210D is thereby configured to bias the data line toward a logic voltage level of the logic node in the read operation. In some embodiments, biasing the data line toward the logic voltage level of the logic node in the read operation includes biasing the data line toward the logic voltage level stored in the memory cell as a result of a preceding write operation.

In the embodiment depicted in FIG. 2, switching device 212 is a single switching device electrically coupled between the data line and node 214. In some embodiments, each of cells 210A, 210B, 210C, and 210D includes an additional switching device (not shown) electrically coupled between the data line and node 214. In some embodiments, the additional switching device is configured to electrically couple the data line with node 214 responsive to a logic state of cell 210A, 210B, 210C, or 210D.

By including switching device 212 communicatively coupled with a read signal line, e.g., one of read signal lines RWL1 or RWL2, each of cells 210A, 210B, 210C, and 210D is configured to bias the data line toward the voltage level responsive to a read signal, e.g., one of read signals RWL1S or RWL2S, in the read operation.

In some embodiments in which switching device 212 includes an n-type transistor, each of cells 210A, 210B, 210C, and 210D is thereby configured to bias the data line toward the voltage level in response to the read signal having a high logic voltage level in the read operation. In some embodiments in which switching device 212 includes a p-type transistor, each of cells 210A, 210B, 210C, and 210D is thereby configured to bias the data line toward the voltage level in response to the read signal having a low logic voltage level in the read operation.

Memory circuit 200 is configured so that read signals RWL1 and RWL2 have a same logic voltage level in the read operation, as discussed above with respect to memory circuit 100 and FIGS. 1A-1C. In response to read signals RWL1 and RWL2 having the same logic voltage level, cells 210A and 210C are configured to simultaneously bias data line RBL1 toward the voltage level on node 214 in the read operation, and cells 210B and 210D are configured to simultaneously bias data line RBL2 toward the voltage level on node 214 in the read operation.

Biasing the data line toward the voltage level in the read operation includes causing a current to flow in the data line, e.g., a current IB in data line RBL1, through the switching devices 212 of the cell or cells configured to bias the data line toward the voltage level in the read operation.

Because cells 210A and 210C are configured to simultaneously bias data line RBL1 toward the voltage level on node 214 in the read operation, current IB is the sum of a current I210A flowing through switching device 212 of cell 210A and a current I210C flowing through switching device 212 of cell 210C.

A speed at which data line RBL1 is biased toward the voltage level at node 214 increases as a magnitude of current IB increases. Because current IB includes components from the two cell currents 1210A and 1210C, current IB has a magnitude greater than a current with a single component from a single cell of a same cell type as that of cells 210A and 210C. Data line RBL1 is therefore biased toward the voltage level at node 214 at a speed greater than a speed at which a data line biased by a single cell of the same cell type is biased toward the voltage level at node 214 in a read operation.

By the configuration discussed above, memory circuit 200 is capable of enabling the benefits discussed above with respect to memory circuit 100 and FIG. 1.

Figure 3:
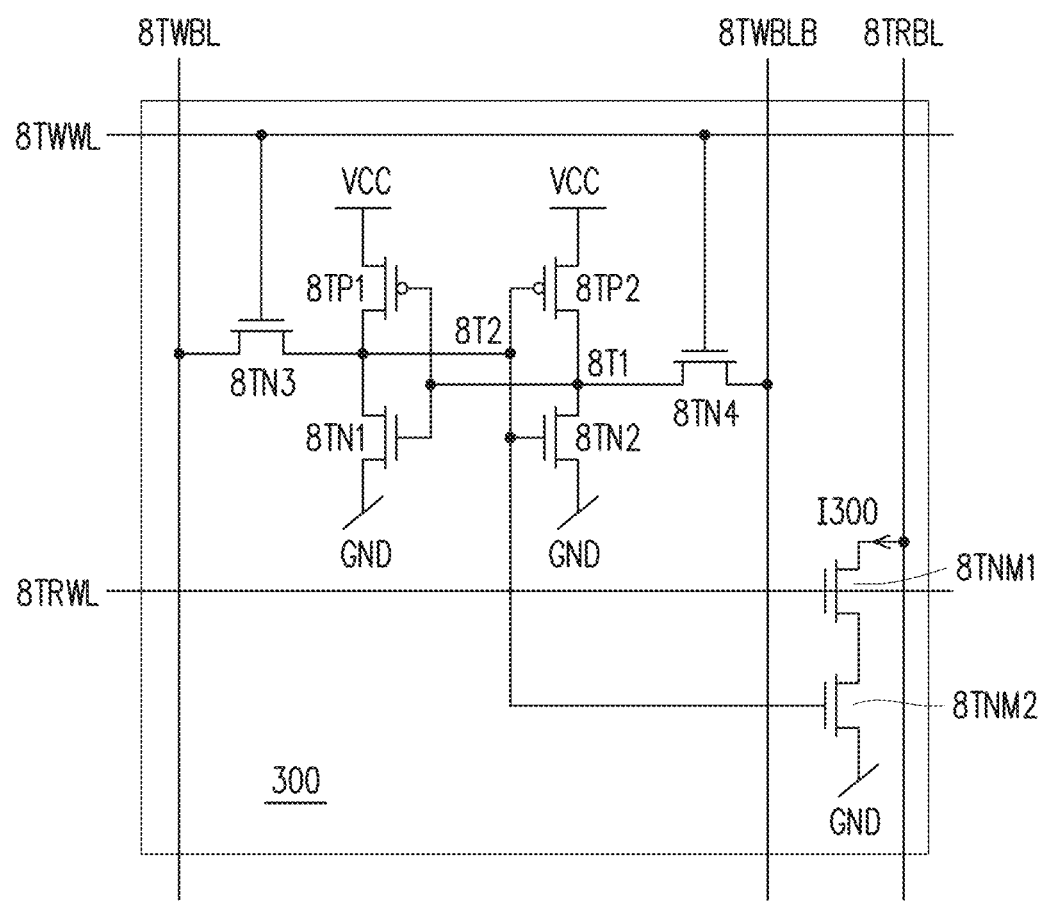
FIG. 3 is a diagram of a memory circuit, in accordance with some embodiments.

FIG. 3 is a diagram of a memory circuit, in accordance with some embodiments. FIG. 3 depicts a memory cell 300, data lines 8TRBL, 8TWBL, and 8TWBLB, a read signal line 8TRWL, and a write signal line 8TWWL. Memory cell 300 is usable as memory cells 112, discussed above with respect to memory circuit 100 and FIGS. 1A-1C.

Memory cell 300 is usable as cells 210A, 210B, 210C, and 210D, data line 8TRBL is usable as data lines RBL1 and RBL2, and read signal line 8TRWL is usable as read signal lines RWL1 and RWL2, each discussed above with respect to memory circuit 200 and FIG. 2. Write signal line 8TWWL is usable as a portion of R/W signal bus 115, discussed above with respect to memory circuit 100 and FIGS. 1A-1C. Memory cell 300 includes transistor 8TNM1 usable as part or all of switching device 212, discussed above with respect to memory circuit 200 and FIG. 2.

Memory cell 300 is an 8T SRAM memory cell that includes a power supply node VCC configured to carry an operating voltage and a reference node GND configured to carry a ground reference voltage. A p-type transistor 8TP1 and an n-type transistor 8TN1 are electrically coupled in series between power supply node VCC and reference node GND, and a p-type transistor 8TP2 and an n-type transistor 8TN2 are electrically coupled in series between power supply node VCC and reference node GND.

Gates of transistors 8TP1 and 8TN1 are electrically coupled with each other and with drains of transistors 8TP2 and 8TN2 at node 8T1, and gates of transistors 8TP2 and 8TN2 are electrically coupled with each other and with drains of transistors 8TP1 and 8TN1 at node 8T2, memory cell 300 thereby being configured to latch a first logic voltage level on node 8T1 with a second, complementary logic voltage level on node 8T2.

An n-type transistor 8TN3 is electrically coupled between node 8T2 and data line 8TWBL, and has a gate communicatively coupled with write signal line 8TWWL. Transistor 8TN3 is thereby configured to electrically couple node 8T2 with data line 8TWBL responsive to a high logic voltage level of a write signal (not labeled) on write signal line 8TWWL during a write operation.

An n-type transistor 8TN4 is electrically coupled between node 8T1 and data line 8TWBLB, and has a gate communicatively coupled with write signal line 8TWWL. Transistor 8TN4 is thereby configured to electrically couple node 8T1 with data line 8TWBLB responsive to the high logic voltage level of the write signal on write signal line 8TWWL during a write operation.

N-type transistor 8TNM1 and an n-type transistor 8TNM2 are electrically coupled in series between data line 8TRBL and reference node GND. A gate of transistor 8TNM1 is communicatively coupled with read signal line 8TRWL and a gate of transistor 8TNM2 is communicatively coupled with node 8T2. Transistors 8TNM1 and 8TNM2 are thereby configured to electrically couple data line 8TRBL with reference node GND responsive to a high logic voltage level on read signal line 8TRWL and a high logic voltage level on node 8T2.

In some embodiments, memory cell 300 is part of a memory macro that includes a sense amplifier, data line 8TRBL is electrically coupled with the sense amplifier, and the sense amplifier is configured to determine a logical state of memory cell 300 based on a voltage level on data line 8TRBL in a read operation of the memory macro.

In some embodiments, in a read operation, data line 8TRBL is pre-charged to a pre-charge voltage level different from a ground reference voltage level of the ground reference voltage on reference node GND.

In a read operation in which transistors 8TNM1 and 8TNM2 are both switched on, a current I300 flows between data line 8TRBL and reference node GND based on a potential difference between the data line 8TRBL and reference node GND voltage levels and on-state resistance values of each of transistors 8TNM1 and 8TNM2.

The on-state resistance values of transistors 8TNM1 and 8TNM2 vary with respect to a value of the high logic voltage level applied to the gates of transistors 8TNM1 and 8TNM2, and with respect to physical properties governed by manufacturing process variations.

By the configuration and usage discussed above with respect to memory circuits 100 and 200 and FIGS. 1A and 2, memory cell 300 is capable of enabling the benefits discussed above with respect to memory circuit 100 and FIGS. 1A-1C.

Figure 4:
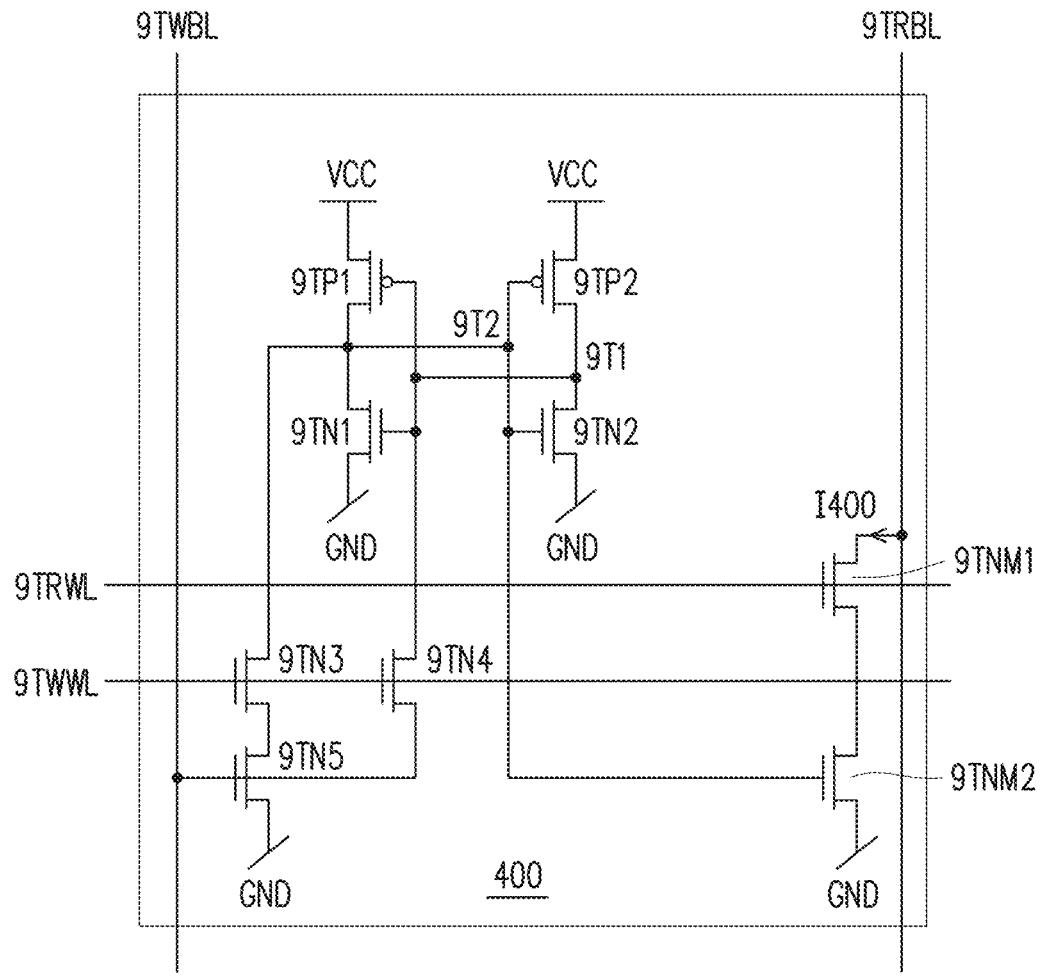
FIG. 4 is a diagram of a memory circuit, in accordance with some embodiments.

FIG. 4 is a diagram of a memory circuit, in accordance with some embodiments. FIG. 4 depicts a memory cell 400, data lines 9TRBL and 9TWBL, a read signal line 9TRWL, and a write signal line 9TWWL. Memory cell 400 is usable as memory cells 112, discussed above with respect to memory circuit 100 and FIGS. 1A-1C.

Memory cell 400 is usable as cells 210A, 210B, 210C, and 210D, data line 9TRBL is usable as data lines RBL1 and RBL2, and read signal line 9TRWL is usable as read signal lines RWL1 and RWL2, each discussed above with respect to memory circuit 200 and FIG. 2. Write signal line 9TWWL is usable as a portion of R/W signal bus 115, discussed above with respect to memory circuit 100 and FIGS. 1A-1C. Memory cell 400 includes transistor 9TNM1 usable as part or all of switching device 212, discussed above with respect to memory circuit 200 and FIG. 2.

Memory cell 400 is a 9T SRAM memory cell that includes power supply node VCC configured to carry the operating voltage and reference node GND configured to carry the ground reference voltage. A p-type transistor 9TP1 and an n-type transistor 9TN1 are electrically coupled in series between power supply node VCC and reference node GND, and a p-type transistor 9TP2 and an n-type transistor 9TN2 are electrically coupled in series between power supply node VCC and reference node GND.

Gates of transistors 9TP1 and 9TN1 are electrically coupled with each other and with drains of transistors 9TP2 and 9TN2 at node 9T1, and gates of transistors 9TP2 and 9TN2 are electrically coupled with each other and with drains of transistors 9TP1 and 9TN1 at node 9T2, memory cell 400 thereby being configured to latch a first logic voltage level on node 9T1 with a second, complementary logic voltage level on node 9T2.

An n-type transistor 9TN4 is electrically coupled between node 9T1 and data line 9TWBL, and has a gate communicatively coupled with write signal line 9TWWL. Transistor 9TN4 is thereby configured to electrically couple node 9T1 with data line 9TWBL responsive to a high logic voltage level of a write signal (not labeled) on write signal line 9TWWL during a write operation.

An n-type transistor 9TN3 and an n-type transistor 9TN5 are electrically coupled in series between node 9T2 and reference node GND. A gate of transistor 9TN3 is communicatively coupled with write signal line 9TWWL and a gate of transistor 9TN5 is communicatively coupled with data line 9TWBL. Transistors 9TN3 and 9TN5 are thereby configured to electrically couple node 9T2 with reference node GND responsive to a high logic voltage level on write signal line 9TWWL and a high logic voltage level on data line 9TWBL.

By the configuration discussed above, memory cell 400 is configured to store complementary logic voltage levels on nodes 9T1 and 9T2 in a write operation.

N-type transistor 9TNM1 and an n-type transistor 9TNM2 are electrically coupled in series between data line 9TRBL and reference node GND. A gate of transistor 9TNM1 is communicatively coupled with read signal line 9TRWL and a gate of transistor 9TNM2 is communicatively coupled with node 9T2. Transistors 9TNM1 and 9TNM2 are thereby configured to electrically couple data line 9TRBL with reference node GND responsive to a high logic voltage level on read signal line 9TRWL and a high logic voltage level on node 9T2.

In some embodiments, memory cell 400 is part of a memory macro that includes a sense amplifier, data line 9TRBL is electrically coupled with the sense amplifier, and the sense amplifier is configured to determine a logical state of memory cell 400 based on a voltage level on data line 9TRBL in a read operation of the memory macro.

In some embodiments, in a read operation, data line 9TRBL is pre-charged to a pre-charge voltage level different from a ground reference voltage level of the ground reference voltage on reference node GND.

In a read operation in which transistors 9TNM1 and 9TNM2 are both switched on, a current I400 flows between data line 9TRBL and reference node GND based on a potential difference between the data line 9TRBL and reference node GND voltage levels and on-state resistance values of each of transistors 9TNM1 and 9TNM2.

The on-state resistance values of transistors 9TNM1 and 9TNM2 vary with respect to a value of the high logic voltage level applied to the gates of transistors 9TNM1 and 9TNM2, and with respect to physical properties governed by manufacturing process variations.

By the configuration and usage discussed above with respect to memory circuits 100 and 200 and FIGS. 1A-1C and 2, memory cell 400 is capable of enabling the benefits discussed above with respect to memory circuit 100 and FIGS. 1A-1C.

Figure 5A:
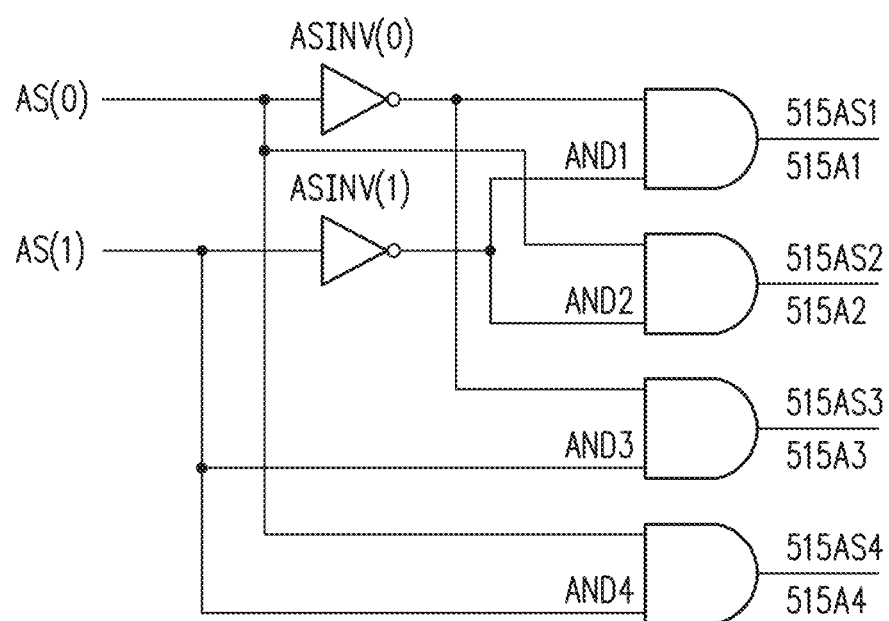
FIGS. 5A-5C are diagrams of address decoding circuits, in accordance with some embodiments.

FIG. 5A is a diagram of an address decoding circuit 520A, in accordance with some embodiments. Address decoding circuit 520A is usable as a portion or all of address decoding circuit 120A, discussed above with respect to memory circuit 100 and FIGS. 1A-1C.

Address decoding circuit 520A includes inverters ASINV(0) and ASINV(1) and AND gates AND1, AND2, AND3, and AND4. Input terminals of inverters ASINV(0) and ASINV(1) are communicatively coupled with control signal bus 125, and output terminals of AND gates AND1, AND2, AND3, and AND4 are communicatively coupled with R/W signal bus 115A, each discussed above with respect to memory circuit 100 and FIGS. 1A-1C.

Inverter ASINV(0) is configured to receive a first bit AS(0) of an address signal at its input terminal, and inverter ASINV(1) is configured to receive a second bit AS(1) of the address signal at its input terminal. Inverter ASINV(0) has an output terminal connected to an input terminal of AND gate AND1 and to an input terminal of AND gate AND3. Inverter ASINV(1) has an output terminal connected to an input terminal of AND gate AND1 and to an input terminal of AND gate AND2.

In addition to the connections to inverters ASINV(0) and ASINV(1), AND gate AND1 has an output terminal connected to a signal line 515A1. AND gate AND1 is thereby configured to receive inverted address bit AS(0) and inverted address bit AS(1), and to output a signal 515AS1 on signal line 515A1. Signal 515AS1 therefore has a logic high level when each of address bits AS(0) and AS(1) has a logic low level, and has a logic low level otherwise.

In addition to the connection to inverter ASINV(1), AND gate AND2 has an input terminal configured to receive first address bit AS(0), and an output terminal connected to a signal line 515A2. AND gate AND2 is thereby configured to receive address bit AS(0) and inverted address bit AS(1), and to output a signal 515AS2 on signal line 515A2. Signal 515AS2 therefore has a logic high level when address bit AS(0) has a logic high level and address bit AS(1) has a logic low level, and has a logic low level otherwise.

In addition to the connection to inverter ASINV(0), AND gate AND3 has an input terminal configured to receive second address bit AS(1), and an output terminal connected to a signal line 515A3. AND gate AND3 is thereby configured to receive inverted address bit AS(0) and address bit AS(1), and to output a signal 515AS3 on signal line 515A3. Signal 515AS3 therefore has a logic high level when address bit AS(0) has a logic low level and address bit AS(1) has a logic high level, and has a logic low level otherwise.

AND gate AND4 has an input terminal configured to receive first address bit AS(0), an input terminal configured to receive second address bit AS(1), and an output terminal connected to a signal line 515A4. AND gate AND4 is thereby configured to receive address bits AS(0) and AS(1), and to output a signal 515AS4 on signal line 515A4. Signal 515AS4 therefore has a logic high level when each of address bits AS(0) and AS(1) has a logic high level, and has a logic low level otherwise.

In the embodiment depicted in FIG. 5A, address decoding circuit 520A includes two inverters, ASINV(0) and ASINV(1), and four AND gates, AND1 . . . AND4, configured to receive two bits, AS(0) and AS(1), of the address signal having two bits. In some embodiments, address decoding circuit 520A includes at least one inverter (not shown) in addition to inverters ASINV(0) and ASINV(1), and at least one AND gate (not shown) in addition to AND gates AND1 . . . AND4, and address decoding circuit 520A is thereby configured to receive the address signal having a number of bits greater than two. In some embodiments, address decoding circuit 520A is configured to receive the address signal having a number n bits, discussed below with respect to decoding circuit 520B and FIG. 5C.

By the configuration discussed above, address decoding circuit 520A is capable of outputting signals, e.g., output signals 515AS1 . . . 515AS4, having logic levels corresponding to each possible combination of logic levels of address bits, e.g., address bits AS(0) and AS(1). In some embodiments, address decoding circuit 520A has a configuration other than the configuration depicted in FIG. 5A such that address decoding circuit 520A is capable of outputting signals having logic levels corresponding to each possible combination of logic levels of address bits.

By the configuration and usage discussed above, decoding circuit 520A is capable of enabling the benefits discussed above with respect to memory circuit 100 and FIGS. 1A-1C.

Figure 5B:
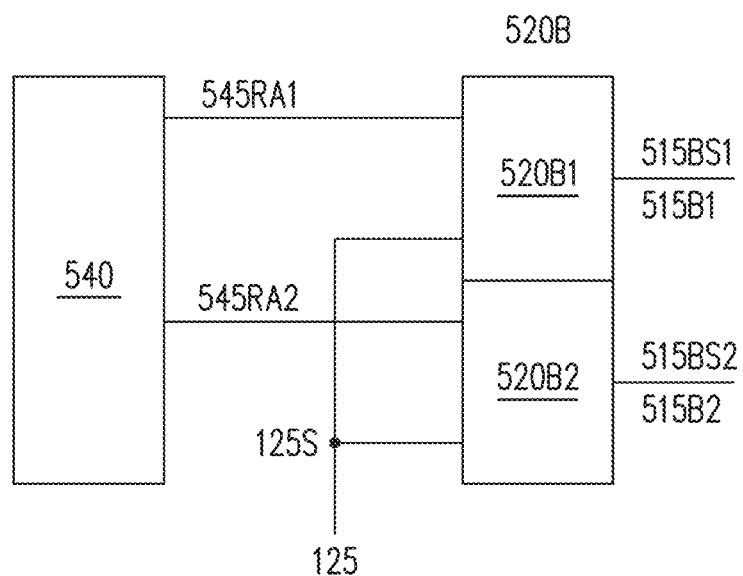

FIG. 5B is a diagram of an address decoding circuit 520B, in accordance with some embodiments. Address decoding circuit 520B is usable as a portion or all of address decoding circuit 120B, discussed above with respect to memory circuit 100 and FIGS. 1A-1C.

In addition to address decoding circuit 520B, FIG. 5B depicts a storage device 540, usable as storage device 140, reference address lines 545RA1 and 545RA2, usable as a portion or all of reference address bus 145, and control signal bus 125, each discussed above with respect to memory circuit 100 and FIGS. 1A-1C.

Address decoding circuit 520B includes a first portion 520B1 communicatively coupled with storage device 540 through reference address lines 545RA1, and a second portion 520B2 communicatively coupled with storage device 540 through reference address lines 545RA2. A non-limiting example of first portion 520B1 is discussed below with respect to FIG. 5C.

Reference address lines 545RA1 are configured to communicate first reference address information corresponding to a first row of set of rows 110A to first portion 520B1, and reference address lines 545RA2 are configured to communicate second reference address information corresponding to a second row of set of rows 110A to second portion 520B2.

First portion 520B1 is configured to, in operation, generate and output a signal 515BS1 on a signal line 515B1 based on a comparison of row address information in control signals 125S received from control signal bus 125 with the first reference address information stored in storage device 540 and received from reference address lines 545RA1. Second portion 520B2 is configured to, in operation, generate and output a signal 515BS2 on a signal line 515B2 based on a comparison of row address information in control signals 125S received from control signal bus 125 with the second reference address information stored in storage device 540 and received from reference address lines 545RA2.

Each of first portion 520B1 and second portion 520B2 includes a plurality of logic gates configured to receive control signals 125S and the reference address information at a plurality of input terminals. The plurality of logic gates is configured so that, in operation, a corresponding signal 515BS1 or 515BS2 is generated having a first logic level when the row address information in control signals 125S matches the reference address information and a second logic level when the row address information in control signals 125S does not match the reference address information.

Address decoder 520B is thereby configured to separately generate and output signals 515BS1 and 515BS2 on respective signal lines 515B1 and 515B2, the output signals 515BS1 and 515BS2 being selectively responsive to row address information corresponding to respective rows of set of rows 110A.

In the embodiment depicted in FIG. 5B, address decoder 520B includes two portions 520B1 and 520B2. In some embodiments, address decoder 520B includes at least one portion (not shown) in addition to portions 520B1 and 520B2, and is thereby configured to separately generate and output at least one signal (not shown) in addition to signals 515BS1 and 515BS2 on at least one signal line (not shown) in addition to signal lines 515B1 and 515B2.

In various embodiments, portions 520B1 and 520B2 have a same or differing configurations by which address decoder 520B is configured to separately generate and output signals 515BS1 and 515BS2. In some embodiments, portions 520B1 and 520B2 share a subset or all of their respective circuit elements such that address decoder 520B is a single circuit configured to separately generate and output signals 515BS1 and 515BS2.

Figure 5C:
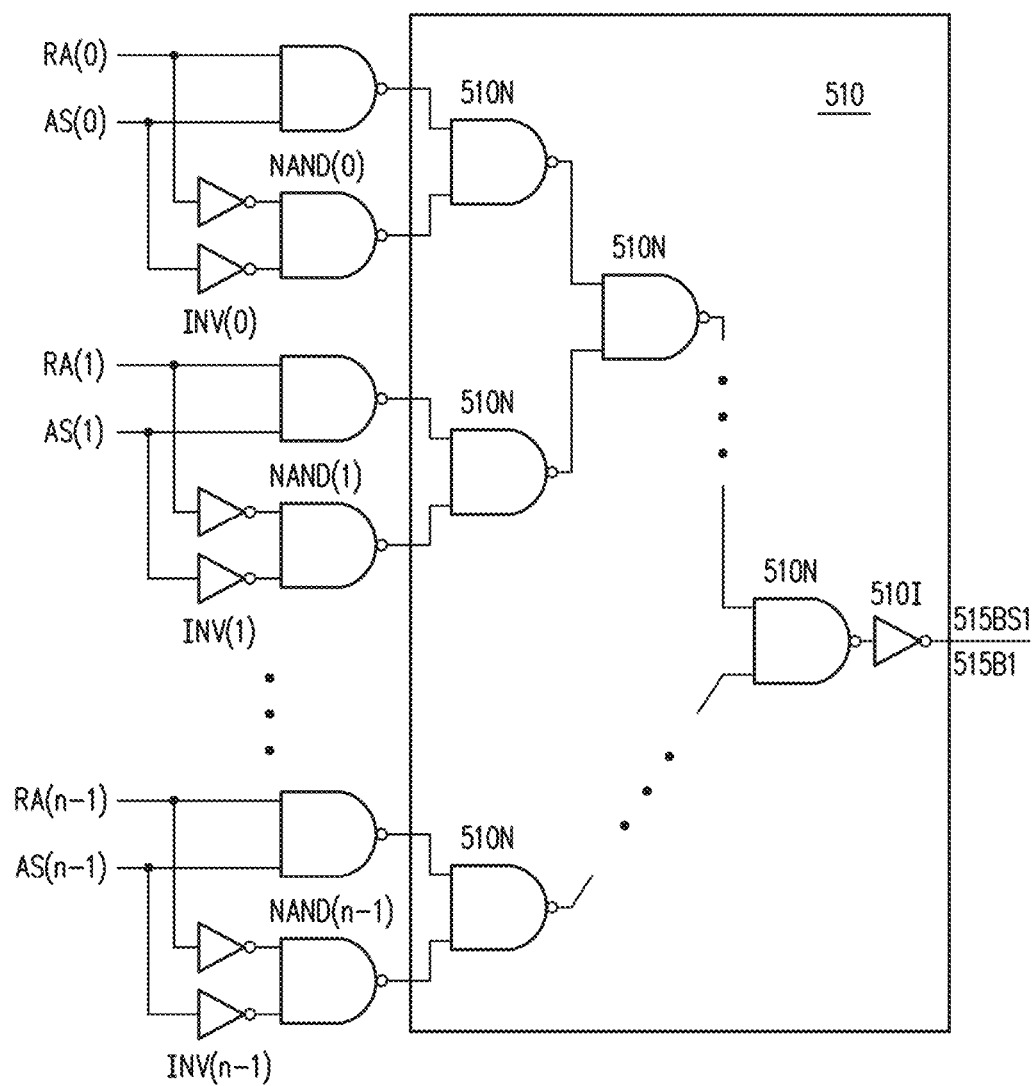

FIG. 5C is a diagram of a non-limiting example of address decoding circuit 520B1, in accordance with some embodiments. Address decoding circuit 520B1 includes a number n of NAND pairs NAND(0) . . . NAND(n−1), n inverter pairs INV(0) . . . INV(n−1), and a logic tree 510. Input terminals of a first NAND of each NAND pair NAND(0) . . . NAND(n−1) are connected to input terminals of a corresponding inverter pair of inverter pairs INV(0) . . . INV(n−1), and output terminals of the inverter pair are connected to input terminals of the second NAND of the NAND pair. Output terminals of each NAND pair NAND(0) . . . NAND(n−1) are connected to logic tree 510, and an output terminal of logic tree 510 is connected to signal line 515B1.

A first input terminal of each NAND of NAND pairs NAND(0) . . . NAND(n−1) is communicatively coupled with control signal bus 125 and a second input terminal of each NAND of NAND pairs NAND(0) . . . NAND(n−1) is communicatively coupled with reference address lines 545RA1. Output signal line 515B1 is communicatively coupled with R/W signal bus 115B, discussed above with respect to memory circuit 100 and FIGS. 1A-1C.

The number n corresponds to a number of bits in a row address. In some embodiments, the row address has a number of bits n ranging from 2 to 9. In some embodiments, the row address has a number of bits n ranging from 7 to 8. In some embodiments, the row address has a total number of bits greater than n, and n represents a portion of the total number of bits in the row address.

The first NAND of each NAND pair NAND(0) . . . NAND(n−1) is configured to receive a corresponding bit of a reference address RA(0) . . . RA(n−1) at a first input terminal and a corresponding bit of an address signal AS(0) . . . AS(n−1) at a second input terminal. The second NAND of each NAND pair NAND(0) . . . NAND(n−1) is configured to receive the corresponding bit of reference address RA(0) . . . RA(n−1), inverted by the first inverter of the corresponding inverter pair INV(0) . . . INV(n−1), at a first input terminal, and the corresponding bit of address signal AS(0) . . . AS(n−1), inverted by the second inverter of the corresponding inverter pair INV(0) . . . INV(n−1), at a second input terminal.

Each NAND pair NAND(0) . . . NAND(n−1) is thereby configured to output one logic high level and one logic low level when the corresponding reference address and address signal bits match, and to output two logic high levels when the corresponding reference address and address signal bits do not match.

Logic tree 510 includes a plurality of NAND gates 510N arranged in tiers and an inverter 510I. A first tier of NAND gates has input terminals configured to receive the logic levels output by NAND pairs NAND(0) . . . NAND(n−1), and subsequent tiers have input terminals connected to output terminals of previous tiers, with a final NAND gate having an output terminal connected to an input terminal of inverter 510I. Inverter 510I has an output terminal configured to output signal 515B1S on signal line 515B1.

Each tier of NAND gates is thereby configured to output logic levels based on input logic levels such that signal 515B1S has a first logic level corresponding to NAND pair NAND(0) . . . NAND(n−1) logic levels consistent with a match of all reference address and address signal bits, and a second logic level corresponding to NAND pair NAND(0) . . . NAND(n−1) logic levels consistent with a mismatch between one or more of the reference address and address signal bits.

In some embodiments, the first logic level is a high logic level and the second logic level is a low logic level. In some embodiments, the first logic level is a low logic level and the second logic level is a high logic level.

In the embodiment depicted in FIG. 5C, each logic gate of NAND tree 510 is a NAND gate 510N. In some embodiments, logic tree 510 includes a plurality of logic gate types (not shown).

By the configuration and usage discussed above, decoding circuit 520B including portions 520B1 and 520B2 is capable of enabling the benefits discussed above with respect to memory circuit 100 and FIGS. 1A-1C.

Figure 6:
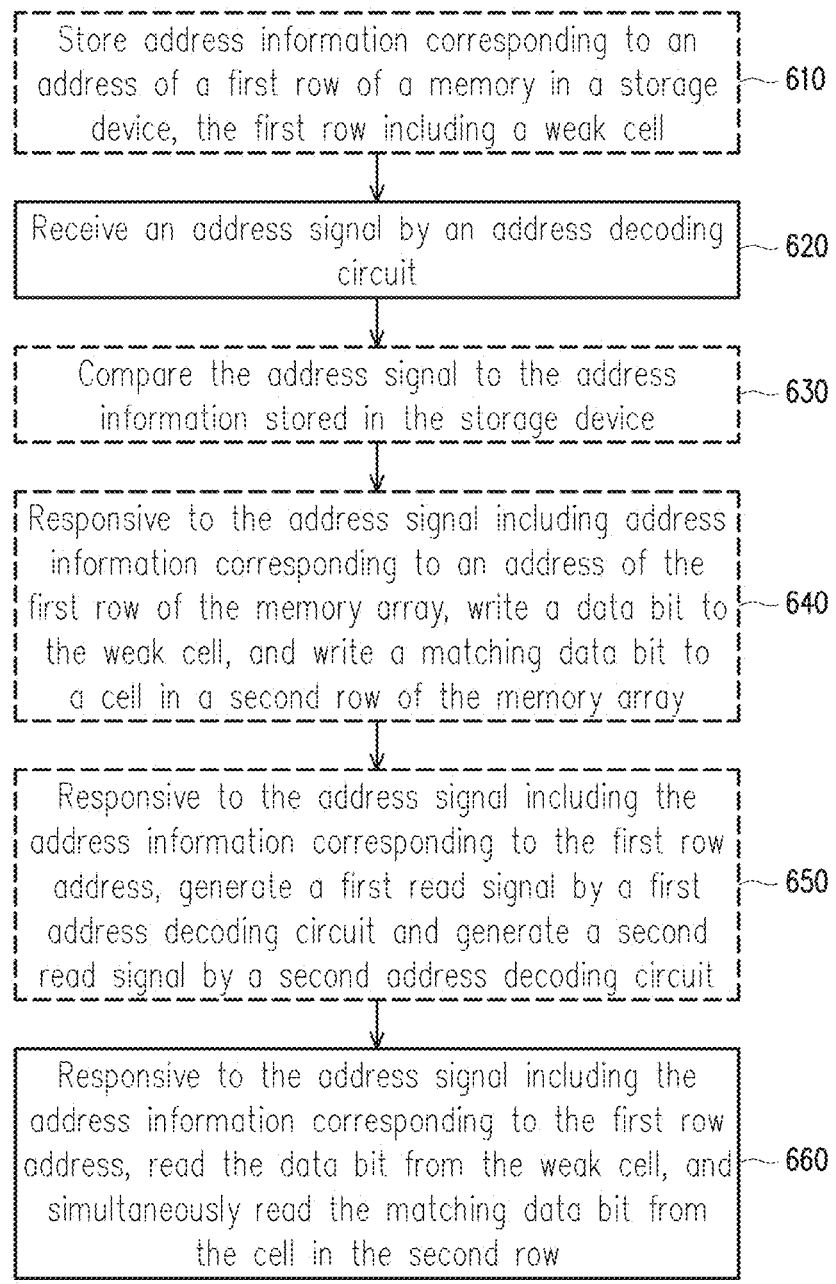
FIG. 6 is a flowchart of a method of reading data from a weak cell, in accordance with some embodiments.

FIG. 6 is a flowchart of a method 600 of reading data from a weak cell, in accordance with one or more embodiments. Method 600 is usable with a memory circuit, e.g., memory circuits 100, 200, 300, or 400, discussed above with respect to FIGS. 1A-1C and 2-4, respectively.

The sequence in which the operations of method 600 are depicted in FIG. 6 is for illustration only; the operations of method 600 are capable of being executed in sequences that differ from that depicted in FIG. 6. In some embodiments, operations in addition to those depicted in FIG. 6 are performed before, between, during, and/or after the operations depicted in FIG. 6. In some embodiments, the operations of method 600 are a subset of operations of a method of operating a memory circuit.

At operation 610, in some embodiments, address information corresponding to an address of a first row of a memory array is stored in a storage device. The first row of the memory array includes the weak cell. Storing the address information includes storing information usable by an address decoding circuit to identify a row of the memory array. In some embodiments, storing the address information in the storage device includes storing reference address information in storage device 140, discussed above with respect to memory circuit 100 and FIGS. 1A-1C.

In some embodiments, storing the address information includes storing a row address. In some embodiments, storing the address information includes storing a portion of a row address. In some embodiments, storing the address information includes storing an index or other identifier corresponding to a row address.

Storing the address information includes storing the address information corresponding to a row identified as a weak row. In some embodiments, storing the address information includes storing the address information corresponding to a row identified as a weak row in the manner described for operation 710 of method 700, discussed below with respect to FIG. 7.

In some embodiments, storing the address information includes storing the address information corresponding to the first row of the memory array based on a speed operation using the weak cell. In some embodiments, the first row of the memory array is one row of a set of rows of the memory array, the set of rows corresponds to a set of read operation speeds including one or more slowest speeds, and storing the address information includes the weak cell having one of the one or more slowest speeds.

In some embodiments, storing the address information includes storing the address information corresponding to a weak row identified using control circuit 130 of memory circuit 100, discussed above with respect to FIGS. 1A-1C.

At operation 620, an address signal is received by an address decoding circuit. Receiving the address signal includes receiving address signal information usable by the address decoding circuit to identify the first row of the memory array. In some embodiments, receiving the address signal information includes receiving control signals 125S from control signal bus 125 by address decoding circuit 120B, discussed above with respect to memory circuit 100 and FIGS. 1A-1C.

In some embodiments, receiving the address signal information includes receiving an address of the first row. In some embodiments, receiving the address signal information includes receiving a portion of the first row address. In some embodiments, receiving the address signal information includes receiving an index or other identifier corresponding to the first row address.

At operation 630, in some embodiments, the address signal is compared with the address information stored in the storage device. Comparing the address signal with the address information stored in the storage device includes comparing address signal information contained in the address signal with the stored address information.

In some embodiments, comparing the address signal information with the address information stored in the storage device includes comparing the address signal information with the stored address information using address decoding circuit 120B, discussed above with respect to memory circuit 100 and FIGS. 1A-1C. In some embodiments, comparing the address signal information with the address information stored in the storage device includes comparing an address signal address with a stored address using address decoding circuit 520B, discussed above with respect to FIGS. 5B and 5C.

In some embodiments, comparing the address signal with the address information stored in the storage device includes determining that the first row address identified by the address signal information matches the first row address identified by the address information stored in the storage device.

At operation 640, in some embodiments, responsive to the address signal including address information corresponding to the first row address, a data bit is written to the weak cell in the first row of the memory array by programming the weak cell to a first logical state, and a matching data bit is written to a cell in a second row of the memory array by programming the cell in the second row of the memory array to the first logical state.

In some embodiments, programming the weak cell and the cell in the second row of the memory array to the first logical state includes storing a first logic voltage level in the weak cell and a second logic voltage level in the cell in the second row of the memory array, the first logic voltage level being the same logic voltage level as the second logic voltage level.

In some embodiments, programming the weak cell and programming the cell in the second row of the memory array are executed simultaneously. In some embodiments, programming the weak cell and programming the cell in the second row of the memory array includes transferring data to both the weak cell and the cell in the second row of the memory array using a same data line. In some embodiments, programming the weak cell and programming the cell in the second row of the memory array are executed as part of a single write operation of the memory array.

In some embodiments, programming the weak cell includes programming a memory cell 112 in a row 110A and programming the cell in the second row of the memory array includes programming a memory cell 112 in a row 110B, discussed above with respect to memory circuit 100 and FIGS. 1A-1C. In some embodiments, each of programming the weak cell and programming the cell in the second row of the memory array includes programming one of cells 210A, 210B, 210C, or 210D, discussed above with respect to memory circuit 200 and FIG. 2. In some embodiments, each of programming the weak cell and programming the cell in the second row of the memory array includes programming a memory cell 300, discussed above with respect to FIG. 3. In some embodiments, each of programming the weak cell and programming the cell in the second row of the memory array includes programming a memory cell 400, discussed above with respect to FIG. 4.

In some embodiments, programming the weak cell includes generating a first write signal using a first address decoding circuit and receiving the first write signal by the first row of the memory array, and programming the cell in the second row of the memory array includes generating a second write signal using a second address decoding circuit and receiving the second write signal by the second row of the memory array.

In some embodiments, generating the first write signal includes generating a read/write signal 115S using first address decoding circuit 120A and generating the second write signal includes generating a read/write signal 115S using second address decoding circuit 120B, discussed above with respect to memory circuit 100 and FIGS. 1A-1C.

At operation 650, in some embodiments, responsive to the address signal including address information corresponding to the first row address, a first read signal is generated by a first address decoding circuit and a second read signal is generated by a second address decoding circuit.

In some embodiments, generating the first read signal includes generating a read/write signal 115S using first address decoding circuit 120A and generating the second read signal includes generating a read/write signal 115S using second address decoding circuit 120B, discussed above with respect to memory circuit 100 and FIGS. 1A-1C.

At operation 660, responsive to the address signal including address information corresponding to the first row address, the data bit is read from the weak cell and the matching data bit is simultaneously read from the cell in the second row of the memory array.

In some embodiments, reading the data bit from the weak cell includes using the weak cell to electrically couple the data line with a first node carrying a bias voltage level, and reading the matching data bit from the cell in the second row includes using the cell in the second row to electrically couple the data line with a second node carrying the bias voltage level. In some embodiments, responding to the address signal including address information corresponding to the first row address is based on the comparison of the address signal information with the reference address information stored in the storage device.

Using the weak cell to couple the data line with the first node and using the cell in the second row to couple the data line with the second node are executed simultaneously. In some embodiments, using the weak cell to couple the data line with the first node and using the cell in the second row to couple the data line with the second node are executed as part of a single read operation of the memory array.

In some embodiments, using the weak cell includes using a memory cell 112 in a row 110A and using the cell in the second row includes using a memory cell 112 in a row 110B, discussed above with respect to memory circuit 100 and FIGS. 1A-1C. In some embodiments, each of using the weak cell and using the cell in the second row includes using one of cells 210A, 210B, 210C, or 210D, discussed above with respect to memory circuit 200 and FIG. 2. In some embodiments, each of using the weak cell and using the cell in the second row includes using a memory cell 300, discussed above with respect to FIG. 3. In some embodiments, each of using the weak cell and using the cell in the second row includes using a memory cell 400, discussed above with respect to FIG. 4.

In some embodiments, electrically coupling the data line with the first node and electrically coupling the data line with the second node includes electrically coupling a data line 114, discussed above with respect to memory circuit 100 and FIGS. 1A-1C. In some embodiments, electrically coupling the data line with the first node and electrically coupling the data line with the second node includes electrically coupling a data line RBL1 or RBL2, discussed above with respect to memory circuit 200 and FIG. 2. In some embodiments, electrically coupling the data line with the first node and electrically coupling the data line with the second node includes electrically coupling data line 8TRBL, discussed above with respect to FIG. 3. In some embodiments, electrically coupling the data line with the first node and electrically coupling the data line with the second node includes electrically coupling data line 9TRBL, discussed above with respect to FIG. 4.

In some embodiments, the bias voltage level is a ground reference level of the memory array, and each of the using the weak cell and the using the cell in the second row includes discharging the data line toward the ground reference level. In some embodiments, each of the using the weak cell and the using the cell in the second row includes discharging the data line having a pre-charge voltage level based on pre-charging the data line as part of a read operation.

In some embodiments, using the weak cell includes the weak cell receiving the first read signal from the first address decoding circuit, and using the cell in the second row includes the cell in the second row receiving the second read signal from the second address decoding circuit. In some embodiments, receiving the first read signal from the first address decoding circuit includes receiving a read/write signal 115S from address decoding circuit 120A, and receiving the second read signal from the second address decoding circuit includes receiving a read/write signal 115S from address decoding circuit 120B, each discussed above with respect to memory circuit 100 and FIGS. 1A-1C.

In some embodiments, receiving the first read signal includes receiving a read/write signal 115S from R/W signal bus 115A, and receiving the second read signal includes receiving a read/write signal 115S from R/W signal bus 115B, discussed above with respect to memory circuit 100 and FIGS. 1A-1C. In some embodiments, receiving the first read signal includes receiving one of read signal RWL1S on read signal line RWL1 or read signal RWL2S on read signal line RWL2, and receiving the second read signal includes receiving the other of read signal RWL1S on read signal line RWL1 or read signal RWL2S on read signal line RWL2, discussed above with respect to memory circuit 200 and FIG. 2. In some embodiments, each of receiving the first read signal and receiving the second read signal includes receiving the read signal on read signal line 8TRWL, discussed above with respect to FIG. 3. In some embodiments, each of receiving the first read signal and receiving the second read signal includes receiving the read signal on read signal line 9TRWL, discussed above with respect to FIG. 4.

In some embodiments, using the weak cell to electrically couple the data line with the first node is further responsive to the first logic voltage level stored in the weak cell, and using the cell in the second row to electrically couple the data line with the second node is further responsive to the second logic voltage level stored in the cell in the second row.

By executing the operations of method 600, a data bit is read from a weak cell and a matching data bit is simultaneously read from a cell in a second row so as to increase the speed of read operations on one or more rows of a memory array, thereby obtaining the benefits discussed above with respect to memory circuit 100 and FIGS. 1A-1C.

FIG. 7 is a flowchart of a method 700 of configuring a memory circuit, in accordance with one or more embodiments. Method 700 is usable with a memory circuit, e.g., memory circuit 100, discussed above with respect to FIGS. 1A-1C. In some embodiments, some or all of the operations of method 700 are executed using a test circuit, e.g., test circuit 132, discussed above with respect to memory circuit 100 and FIGS. 1A-1C.

The sequence in which the operations of method 700 are depicted in FIG. 7 is for illustration only; the operations of method 700 are capable of being executed in sequences that differ from that depicted in FIG. 7. In some embodiments, operations in addition to those depicted in FIG. 7 are performed before, between, during, and/or after the operations depicted in FIG. 7.

In some embodiments, the operations of method 700 are a subset of operations of a method of configuring a memory circuit. In some embodiments, some or all of the operations of method 700 are performed as part of an initial setup of the memory circuit prior to normal operation of the memory circuit. In some embodiments, some or all of the operations of method 700 are performed as part of a maintenance process after a period of normal operation of the memory circuit.

At operation 710, a weak row of cells of the memory circuit is identified. Identifying the weak row is based on a speed of a test read operation on the weak row meeting a first speed criterion.

In some embodiments, the test read operation is a first test read operation of a plurality of test read operations, and identifying the weak row includes executing the plurality of test read operations on a plurality of rows of a memory array of the memory circuit, the plurality of rows including the weak row. In some embodiments, executing the plurality of test read operations includes executing the plurality of test read operations on set of rows 110A of memory array 110, discussed above with respect to memory circuit 100 and FIGS. 1A-1C.

In some embodiments, executing the plurality of test read operations includes measuring one or more execution speeds of the plurality of test read operations. In some embodiments, executing the plurality of test read operations includes detecting one or more write or read errors.

In some embodiments, executing the plurality of test read operations includes varying an operating frequency of the memory circuit. In some embodiments, the operating frequency is an operating frequency of a system of which the memory circuit is a part. In some embodiments, executing the plurality of test read operations includes varying operating frequency FRQ, discussed above with respect to memory circuit 100 and FIGS. 1A-1C.

In some embodiments, executing the plurality of test read operations includes varying the value of an operating voltage. In some embodiments, the operating voltage is an operating voltage of a system of which the memory circuit is a part. In some embodiments, executing the plurality of test read operations includes varying minimum operating voltage VCCMIN, discussed above with respect to memory circuit 100 and FIGS. 1A-1C.

In some embodiments, executing the plurality of test read operations is performed by a built-in test circuit of the memory circuit. In some embodiments, executing the plurality of test read operations is performed by test circuit 132, discussed above with respect to memory circuit 100 and FIGS. 1A-1C.

In various embodiments, executing the plurality of test read operations is performed by a circuit external to the memory circuit, a combination of circuits internal and external to the memory circuit, or in response to a user of the memory circuit.

In various embodiments, identifying the weak row includes identifying a statistical distribution of a plurality of speeds corresponding to the plurality of test read operations. Non-limiting examples of statistical distributions include a Gaussian distribution or a statistical distribution represented by curve N, discussed above with respect to memory circuit 100 and FIGS. 1A-1C.

In some embodiments, identifying the weak row includes identifying one or more slowest speeds of a plurality of speeds corresponding to the plurality of test read operations. In some embodiments, identifying the weak row based on the speed of the corresponding first test read operation of the plurality of test read operations meeting the first speed criterion includes the speed of the corresponding first test read operation being one of the one or more slowest speeds.

At operation 720, address information corresponding to an address of the weak row is stored in a storage device of the memory circuit. Storing the address information is executed in the manner described for operation 610 of method 600, discussed above with respect to FIG. 6.

At operation 730, during subsequent read operations on the weak row, data are simultaneously read from the weak row and from a second row of cells of the memory circuit based on the stored address information.

In some embodiments, reading data from the weak row includes reading data from a row of set of rows 110A and reading data from the second row includes reading data from a row of set of rows 110B, discussed above with respect to memory circuit 100 and FIGS. 1A-1C.

In some embodiments, simultaneously reading data from the weak row and from the second row is part of configuring the second row of the memory circuit to be enabled during subsequent read operations and during subsequent write operations.

At operation 740, in some embodiments, one or both of a value of the operating frequency of the memory circuit or a value of the operating voltage of the memory circuit is determined based on simultaneously reading data from the weak row and from the second row during the subsequent read operations on the weak row.

In some embodiments, determining the value of the operating frequency includes determining a value of operating frequency FRQ, discussed above with respect to memory circuit 100 and FIGS. 1A-1C. In some embodiments, determining the value of the operating voltage includes determining a value of minimum operating voltage VCCMIN, discussed above with respect to memory circuit 100 and FIGS. 1A-1C.

In some embodiments, determining the value includes determining a first value prior to enabling the second row to be read simultaneously with the weak row and determining a second value after enabling the second row to be read simultaneously with the weak row.

In some embodiments, determining the value includes varying one or both of the operating frequency or the operating voltage while executing a plurality of test read operations on the rows of cells of the memory circuit.

At operation 750, in some embodiments, some or all of operations 710, 720, 730, or 740 are repeated to enable one or more rows in addition to the second row during subsequent read operations on one or more rows of cells of the memory circuit in addition to the weak row.

At operation 760, in some embodiments, one or both of the value of the operating frequency of the memory circuit or the value of the operating voltage of the memory circuit determined at operation 740 is applied to the memory circuit.

In some embodiments, applying the value of the operating frequency includes applying a value of operating frequency FRQ, discussed above with respect to memory circuit 100 and FIGS. 1A-1C. In some embodiments, applying the value of the operating voltage includes applying a value of minimum operating voltage VCCMIN, discussed above with respect to memory circuit 100 and FIGS. 1A-1C.

At operation 770, in some embodiments, the memory circuit is operated with one or both of the value of the operating frequency of the memory circuit or the value of the operating voltage of the memory circuit determined at operation 740 applied to the memory circuit. Operating the memory circuit includes operating the memory circuit with the second row enabled to be read simultaneously with the weak row during subsequent read operations on the weak row.

Performing the operations of method 700 to configure a memory circuit enables one or both of increased operating speed or lowered operating voltage of a memory circuit compared to a memory circuit that is not configured by performing the operations of method 700. As discussed above with respect to memory circuit 100 and FIGS. 1A-1C, an increased operating frequency improves memory circuit performance and compatibility with other circuits, and a lowered operating voltage reduces energy consumption and power-related heat generation.

In one embodiment, a circuit includes: a memory array; a control circuit configured to identify an address of a first row of the memory array containing a weak cell, and store corresponding address information in a storage device; and an address decoding circuit configured to receive the address information stored in the storage device, and in response to the address information matching an address of the first row received in a read operation, activate a second row of the memory array simultaneously with the first row being activated. In some embodiments, the control circuit is configured to identify the address of the first row of the memory array containing the weak cell by determining one or more execution speeds of one or more write and/or read operations on each row of the memory array while varying one or more operating parameters of memory array. In some embodiments, determining one or more execution speeds of one or more write and/or read operations on each row of the memory array while varying one or more operating parameters of memory array comprises determining execution speeds including one or more slowest speeds on a set of rows in the memory array including the first row of the memory array. In some embodiments, the circuit further includes: a data line perpendicular to the first row and the second row, intersecting each of the first cell and the second cell, and electrically coupled with each of the first cell and the second cell; wherein the circuit is configured to simultaneously transfer data from the first cell and the second cell to the data line in a read operation on the first row. In some embodiments, the circuit is configured to simultaneously transfer the data from the first cell and the second cell to the data line based on a logical state of the first cell and the second cell. In some embodiments, the circuit is configured to simultaneously transfer data to the first cell and the second cell in a write operation on the first row. In some embodiments, the circuit further includes: a third cell in a third row of the memory array; and a fourth cell in a fourth row of the memory array, a data line perpendicular to the third row and the fourth row, intersects each of the third cell and the fourth cell, and is electrically coupled with each of the third cell and the fourth cell, and the circuit is configured to simultaneously transfer data from the third cell and the fourth cell to the data line in a read operation on the third row. In some embodiments, the memory array further includes a first plurality of cells, a second plurality of cells, a plurality of data lines, wherein the first cell is one cell of the first plurality of cells in the first row, the second cell is one cell of the second plurality of cells in the second row, a data line of the plurality of data lines is perpendicular to the first row and the second row, each data line of the plurality of data lines intersects a corresponding cell of the first plurality of cells and a corresponding cell of the second plurality of cells, and is electrically coupled with each of the corresponding cell of the first plurality of cells and the corresponding cell of the second plurality of cells, and the circuit is configured to simultaneously transfer data from each cell of the first plurality of cells and each corresponding cell of the second plurality of cells to each corresponding data line of the plurality of data lines in the read operation on the first row. In some embodiments, each of the first cell and the second cell is a static random-access memory (SRAM) cell.

In one embodiment, a method of activating a memory cell, the method comprising: receiving an address signal at a first address decoding circuit, the address signal including address information corresponding to an address of a first row of a memory array, the first row of the memory array including the memory cell; receiving the address signal and stored address information at a second address decoding circuit; and in response to the received address signal and stored address information: using the first address decoding circuit to activate the first row of the memory array, and using the second address decoding circuit to simultaneously activate a second row of the memory array. In some embodiments, the method further includes: reading a data bit from a first cell in the first row of the memory array in response to activating the first row of the memory array; and reading a matching data bit from a second cell in the second row of the memory array in response to simultaneously activating the second row of the memory array. In some embodiments, the reading the data bit from the first cell comprises electrically coupling a data line with a first node carrying a bias voltage level, and the reading the matching data bit from the second cell in the second row of the memory array comprises electrically coupling the data line with a second node carrying the bias voltage level. In some embodiment, the bias voltage level is a ground reference level of the memory array, and each of the electrically coupling the data line with the first node and the electrically coupling the data line with the second node comprises discharging the data line toward the ground reference level. In some embodiments, the data bit corresponds to a first logic voltage level stored in the first cell, the matching data bit corresponds to a second logic voltage level stored in the second cell, and the method further comprises programming the first cell and the second cell to have the first logic voltage level be a same logic voltage level as the second logic voltage level. In some embodiments, decoding circuit to simultaneously activate the second row of the memory array comprises comparing the address signal with address information stored in a storage device, the address information corresponding to the address of the first row. In some embodiments, the method further includes storing the address information in the storage device based on a speed of a read operation using the first row.

In one embodiment, a method of activating a memory cell, includes: identifying an address of a first row of the memory array containing a weak cell; storing corresponding address information in a storage device; receiving the address information stored in the storage device; and in response to the address information matching an address of the first row received in a read operation, activating a second row of the memory array simultaneously with the first row being activated. In some embodiments, the identifying the address of the first row of the memory array containing the weak cell comprises determining one or more execution speeds of one or more write and/or read operations on each row of the memory array while varying one or more operating parameters of memory array. In some embodiments, determining one or more execution speeds while varying one or more operating parameters of memory array comprises determining execution speeds including one or more slowest speeds on a set of rows in the memory array including the first row of the memory array. In some embodiments, the method further includes simultaneously transferring data to the first cell and the second cell in a write operation on the first row.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
   a memory array;
   a control circuit configured to identify an address of a first row of the memory array containing a weak cell, and store corresponding address information in a storage device; and
   an address decoding circuit configured to receive the address information stored in the storage device, and in response to the address information matching the address of the first row received in a read operation, activate a second row of the memory array simultaneously with the first row being activated.

2. The circuit of claim 1, wherein the control circuit is configured to identify the address of the first row of the memory array containing the weak cell by determining one or more execution speeds of one or more write and/or read operations on each row of the memory array while varying one or more operating parameters of the memory array.

3. The circuit of claim 2, wherein determining one or more execution speeds of one or more write and/or read operations on each row of the memory array while varying one or more operating parameters of the memory array comprises determining execution speeds including one or more slowest speeds on a set of rows in the memory array including the first row of the memory array.

4. The circuit of claim 1, further comprising:
   a data line perpendicular to the first row and the second row, the data line intersecting each of the weak cell in the first row and a second cell in the second row;
   wherein the circuit is configured to simultaneously transfer data from the first cell and the second cell to the data line in a read operation on the first row.

5. The circuit of claim 1, wherein the circuit is configured to simultaneously transfer data from the weak cell in the first row and a second cell in the second row to a data line based on a logical state of the weak cell and the second cell.

6. The circuit of claim 1, wherein the circuit is configured to simultaneously transfer data to the weak cell in the first row and a second cell in the second row in a write operation on the first row.

7. The circuit of claim 1, further comprising:
   a second cell in the second row of the memory array;
   a third cell in a third row of the memory array;
   a fourth cell in a fourth row of the memory array;
   a data line perpendicular to the third row and the fourth row, the data line intersecting each of the third cell and the fourth cell, and the data line being electrically coupled with each of the third cell and the fourth cell; and
   the circuit configured to simultaneously transfer data from the third cell and the fourth cell to the data line in a read operation on the third row.

8. The circuit of claim 1, wherein the memory array further comprises a first plurality of cells, a second plurality of cells, and a plurality of data lines, wherein
   the weak cell is one cell of the first plurality of cells in the first row,
   a second cell is one cell of the second plurality of cells in the second row,
   a data line of the plurality of data lines is perpendicular to the first row and the second row,
   each data line of the plurality of data lines intersects a corresponding cell of the first plurality of cells and a corresponding cell of the second plurality of cells, and is electrically coupled with each of the corresponding cell of the first plurality of cells and the corresponding cell of the second plurality of cells, and
   the circuit is configured to simultaneously transfer data from each cell of the first plurality of cells and each corresponding cell of the second plurality of cells to each corresponding data line of the plurality of data lines in the read operation on the first row.

9. The circuit of claim 1, wherein each of the weak cell in the first row and a second cell in the second row is a static random-access memory (SRAM) cell.

10. A method of activating a memory cell, the method comprising:
    receiving an address signal at a first address decoding circuit, the address signal including address information corresponding to an address of a first row of a memory array, the first row of the memory array including the memory cell;
    receiving the address signal and stored address information at a second address decoding circuit; and
    in response to the received address signal and stored address information:
       using the first address decoding circuit to activate the first row of the memory array, and
       using the second address decoding circuit to simultaneously activate a second row of the memory array.

11. The method of claim 10, further comprising:
    reading a data bit from a first cell in the first row of the memory array in response to activating the first row of the memory array; and
    reading a matching data bit from a second cell in the second row of the memory array in response to simultaneously activating the second row of the memory array.

12. The method of claim 11, wherein:
    the reading the data bit from the first cell comprises electrically coupling a data line with a first node carrying a bias voltage level, and
    the reading the matching data bit from the second cell in the second row of the memory array comprises electrically coupling the data line with a second node carrying the bias voltage level.

13. The method of claim 12, wherein
    the bias voltage level is a ground reference level of the memory array, and
    each of the electrically coupling the data line with the first node and the electrically coupling the data line with the second node comprises discharging the data line toward the ground reference level.

14. The method of claim 11, wherein
    the data bit corresponds to a first logic voltage level stored in the first cell,
    the matching data bit corresponds to a second logic voltage level stored in the second cell, and
    the method further comprises programming the first cell and the second cell to have the first logic voltage level be a same logic voltage level as the second logic voltage level.

15. The method of claim 10, wherein the simultaneously using the second address decoding circuit to simultaneously activate the second row of the memory array comprises comparing the address signal with address information stored in a storage device, the address information corresponding to the address of the first row.

16. The method of claim 10, further comprising storing the address information in a storage device based on a speed of a read operation using the first row.

17. A method of activating a memory cell, the method comprising:
  identifying an address of a first row of a memory array containing a weak cell;
  storing corresponding address information in a storage device;
  receiving the address information stored in the storage device; and
  in response to the address information matching the address of the first row received in a read operation, activating a second row of the memory array simultaneously with the first row being activated.

18. The method of claim 17, wherein the identifying the address of the first row of the memory array containing the weak cell comprises determining one or more execution speeds of one or more write and/or read operations on each row of the memory array while varying one or more operating parameters of the memory array.

19. The method of claim 18, wherein determining one or more execution speeds of one or more write and/or read operations on each row of the memory array while varying one or more operating parameters of the memory array comprises determining execution speeds including one or more slowest speeds on a set of rows in the memory array including the first row of the memory array.

20. The method of claim 17, further comprising simultaneously transferring data to the weak cell in the first row and a second cell in the second row in a write operation on the first row.

* * * * *